United States Patent
Yang et al.

(10) Patent No.: US 10,854,724 B2
(45) Date of Patent: *Dec. 1, 2020

(54) ONE-DIMENSIONAL NANOSTRUCTURE GROWTH ON GRAPHENE AND DEVICES THEREOF

(71) Applicants: Taiwan Semiconductor Manufacturing Co., Ltd., Hsinchu (TW); National Taiwan University, Taipei (TW)

(72) Inventors: Che-Wei Yang, New Taipei (TW); Chi-Wen Liu, Hsinchu (TW); Hao-Hsiung Lin, Taipei (TW); Ling-Yen Yeh, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 12 days.

This patent is subject to a terminal disclaimer.

(21) Appl. No.: 16/195,591

(22) Filed: Nov. 19, 2018

(65) Prior Publication Data

US 2019/0088757 A1 Mar. 21, 2019

Related U.S. Application Data

(60) Continuation of application No. 15/652,001, filed on Jul. 17, 2017, now Pat. No. 10,134,865, which is a
(Continued)

(51) Int. Cl.
*H01L 29/423* (2006.01)
*H01L 29/06* (2006.01)
(Continued)

(52) U.S. Cl.
CPC .. *H01L 29/42392* (2013.01); *H01L 21/02444* (2013.01); *H01L 21/02532* (2013.01);
(Continued)

(58) Field of Classification Search
CPC .......... H01L 29/42392; H01L 29/0673; H01L 29/78; H01L 29/66477; H01L 21/2018; H01L 27/1281; H01L 21/02636
See application file for complete search history.

(56) References Cited

U.S. PATENT DOCUMENTS 7,339,186 B2   3/2008  Mio et al.
7,888,753 B2   2/2011  Afzali et al.
(Continued)

OTHER PUBLICATIONS

J. J. Gu et. al., "III-V Gate-all-around Nanowire MOSFET Process Technology: From 3D to 4D", IEDM Tech. Dig. 529 (2012), 4 pages.
(Continued)

*Primary Examiner* — Jarrett J Stark
(74) *Attorney, Agent, or Firm* — Haynes and Boone, LLP

(57) ABSTRACT

A method and structure for providing a GAA device. In some embodiments, a substrate including an insulating layer disposed thereon is provided. By way of example, a first metal portion is formed within the insulating layer. In various embodiments, a first lateral surface of the first metal portion is exposed. After exposure of the first lateral surface of the first metal portion, a first graphene layer is formed on the exposed first lateral surface. In some embodiments, the first graphene layer defines a first vertical plane parallel to the exposed first lateral surface. Thereafter, in some embodiments, a first nanobar is formed on the first graphene layer, where the first nanobar extends in a first direction normal to the first vertical plane defined by the first graphene layer.

20 Claims, 24 Drawing Sheets

Related U.S. Application Data division of application No. 15/130,527, filed on Apr. 15, 2016, now Pat. No. 9,711,607.

(51) Int. Cl.

| | |
|---|---|
| *H01L 29/66* | (2006.01) |
| *H01L 29/775* | (2006.01) |
| *H01L 21/02* | (2006.01) |
| *H01L 29/78* | (2006.01) |
| *H01L 27/12* | (2006.01) |
| *H01L 21/20* | (2006.01) |

(52) U.S. Cl.
CPC .. *H01L 21/02546* (2013.01); *H01L 21/02603* (2013.01); *H01L 21/02645* (2013.01); *H01L 29/0673* (2013.01); *H01L 29/66469* (2013.01); *H01L 29/66477* (2013.01); *H01L 29/775* (2013.01); *H01L 29/78* (2013.01); *H01L 21/02636* (2013.01); *H01L 21/2018* (2013.01); *H01L 27/1281* (2013.01)

(56) References Cited

U.S. PATENT DOCUMENTS

| | | | | |
|---|---|---|---|---|
| 8,063,450 | B2 | 11/2011 | Wernersson et al. | |
| 8,097,515 | B2* | 1/2012 | Bangsaruntip | B82Y 10/00 |
| | | | | 257/24 |
| 8,384,069 | B2 | 2/2013 | Pernel et al. | |
| 9,177,745 | B2 | 11/2015 | Lee et al. | |
| 9,209,247 | B2* | 12/2015 | Colinge | H01L 29/42376 |
| 9,224,811 | B2* | 12/2015 | Cheng | H01L 29/0673 |
| 9,263,260 | B1* | 2/2016 | Basu | H01L 29/401 |
| 9,318,583 | B2* | 4/2016 | Verhulst | H01L 29/66666 |
| 9,449,820 | B2* | 9/2016 | Cohen | H01L 21/02433 |
| 9,711,607 | B1* | 7/2017 | Yang | H01L 29/42392 |
| 9,966,257 | B2* | 5/2018 | Weman | B82Y 10/00 |
| 2005/0029654 | A1* | 2/2005 | Mio | B82Y 10/00 |
| | | | | 257/734 |
| 2008/0150043 | A1* | 6/2008 | Cha | H01L 21/2652 |
| | | | | 257/401 |
| 2010/0022082 | A1* | 1/2010 | Louis | B82Y 10/00 |
| | | | | 438/618 |
| 2010/0273317 | A1* | 10/2010 | Ernst | B82Y 10/00 |
| | | | | 438/479 |
| 2010/0295024 | A1* | 11/2010 | Pernel | B82Y 10/00 |
| | | | | 257/24 |
| 2010/0330687 | A1* | 12/2010 | Afzali-Ardakani | H01L 29/0676 |
| | | | | 436/149 |
| 2011/0097631 | A1* | 4/2011 | Lee | B01J 21/185 |
| | | | | 429/400 |
| 2011/0107569 | A1* | 5/2011 | Wang | H01L 41/316 |
| | | | | 29/25.35 |
| 2011/0249322 | A1* | 10/2011 | Wang | B82Y 20/00 |
| | | | | 359/344 |
| 2013/0109167 | A1* | 5/2013 | Chang | H01L 23/5256 |
| | | | | 438/601 |
| 2014/0197377 | A1* | 7/2014 | Kim | H01L 21/823828 |
| | | | | 257/29 |
| 2015/0021715 | A1* | 1/2015 | Chang | H01L 29/0669 |
| | | | | 257/412 |
| 2015/0076450 | A1* | 3/2015 | Weman | B82Y 10/00 |
| | | | | 257/29 |
| 2015/0097193 | A1* | 4/2015 | Yap | H01L 29/775 |
| | | | | 257/76 |
| 2015/0163923 | A1* | 6/2015 | Currie | B23K 26/364 |
| | | | | 29/846 |
| 2015/0357374 | A1* | 12/2015 | Wang | H01L 27/20 |
| | | | | 257/417 |
| 2016/0027870 | A1* | 1/2016 | Cheng | H01L 29/42356 |
| | | | | 257/347 |
| 2018/0211874 | A1* | 7/2018 | Basker | H01L 21/28088 |
| 2019/0305135 | A1* | 10/2019 | Radosavljevic | H01L 29/16 |
| 2020/0071817 | A1* | 3/2020 | Nasseri | C23C 16/26 |

OTHER PUBLICATIONS

T. Tanaka et al., "Vertical Surrounding Gate Transistors Using Single InAs Nanowires Grown on Si Substrates", Appl. Phys. Express 3, 025003 (2010), 4 pages.

S. Dhara et al., "Facile fabrication of lateral nanowire wrap-gate devices with improved performance", Appl. Phys. Lett. 99, 173101 (2011), 4 pages.

P. K. Mohseni, et al., "In$_x$Ga$_{1-x}$As Nanowire Growth on Graphene: van der Waals Epitaxy Induced Phase Segregation", Nano Lett.,13, pp. 1153-1161,(2013).

D. Dalacu, et al., "Droplet Dynamics in Controlled InAs Nanowire Interconnections", Nano Lett. 13, pp. 2676-2681, (2013).

A. M. Munshi, et al., "Vertically Aligned GaAs Nanowires on Graphite and Few-Layer Graphene: Generic Model and Epitaxial Growth", Nano Lett., 12, pp. 4570-4576, (2012).

Y. Tchoe et al., "Catalyst-free growth of InAs/In$_x$Ga$_{1-x}$ As coaxial nanorod heterostructures on graphene layers using molecular beam epitaxy" NPG Asia Materials, 7, (2015), 5 pages.

Katsuhiro Tomioka, et al., "Integration of III-V nanowires on Si: From high-performance vertical FET to Steep-slope switch" IEDM 13-88, pp. 4 pages.

* cited by examiner

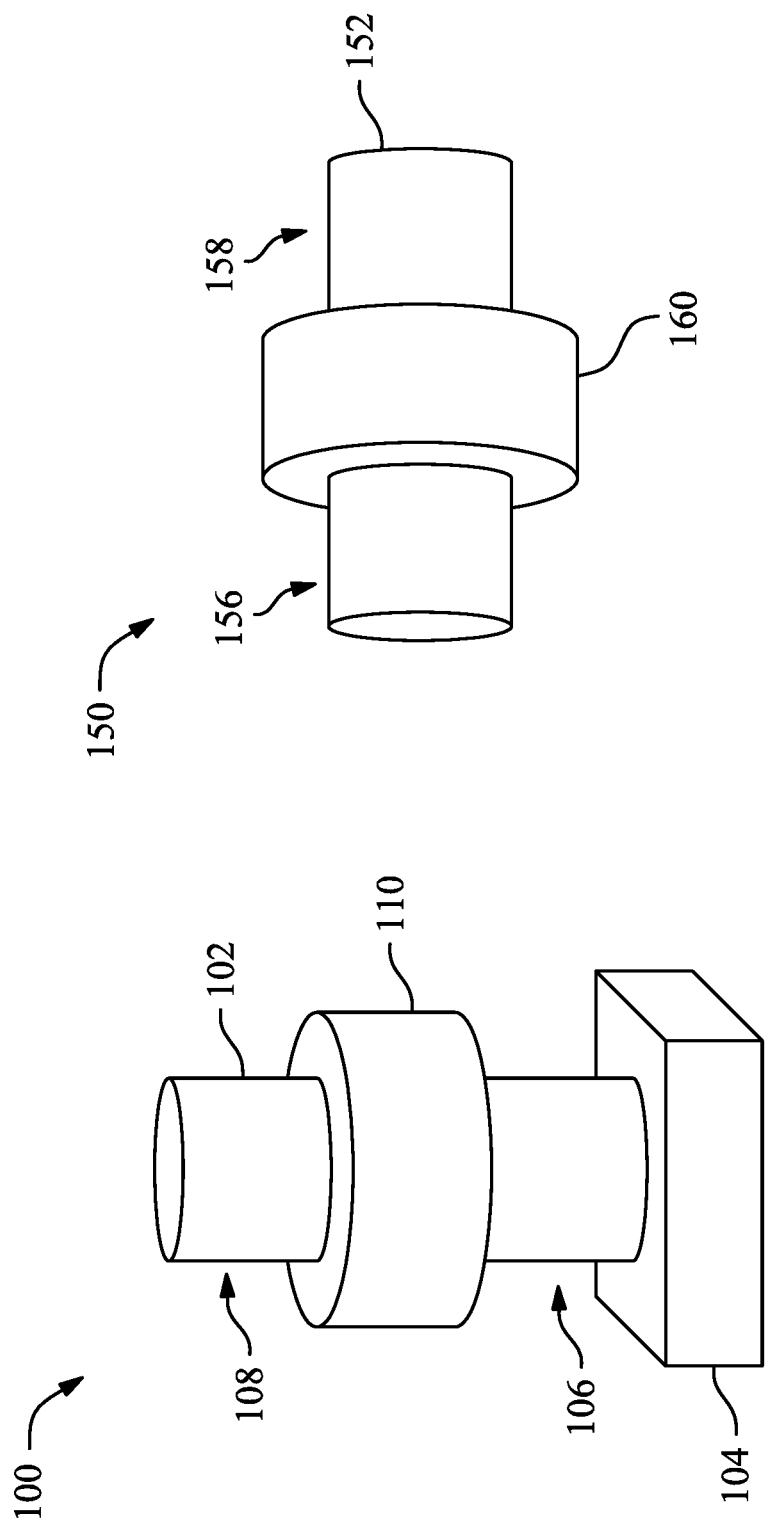

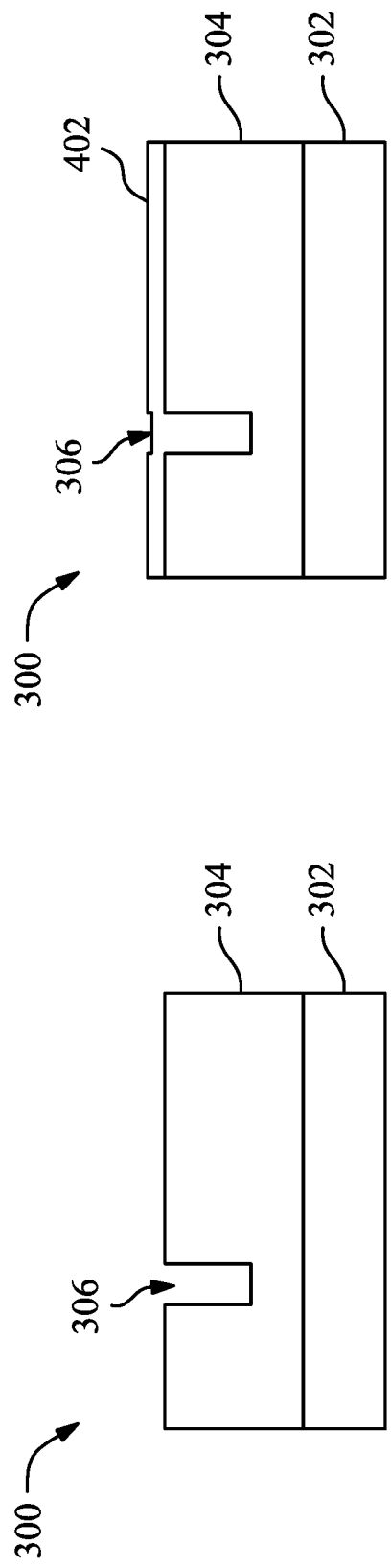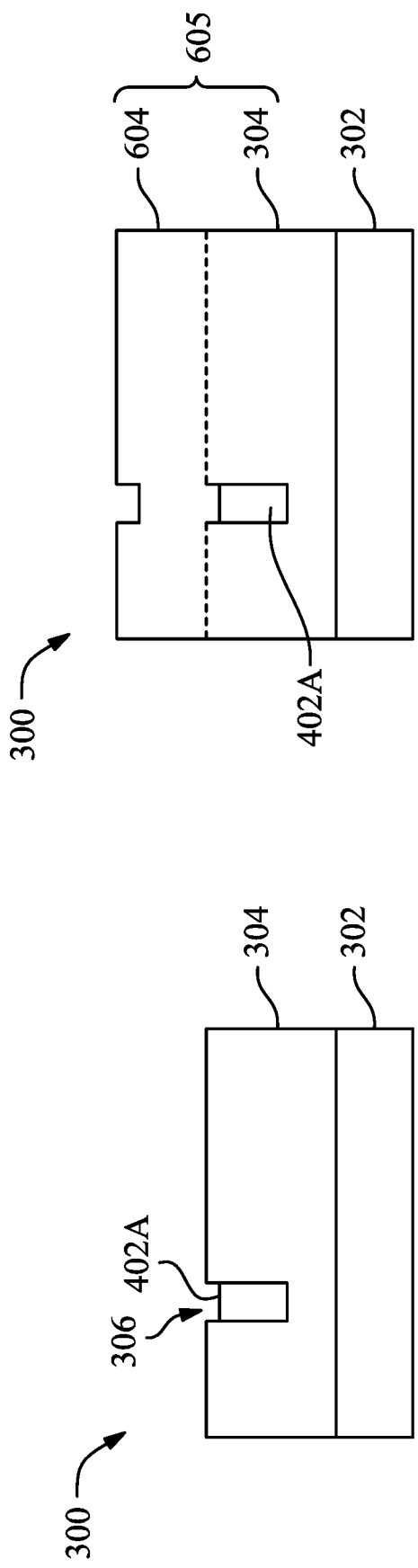

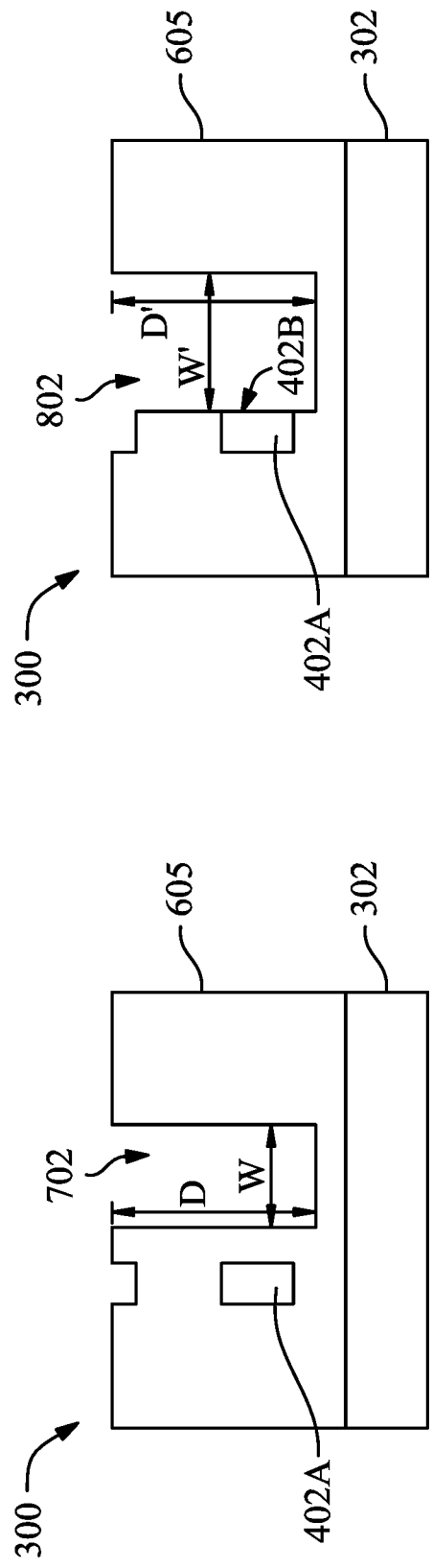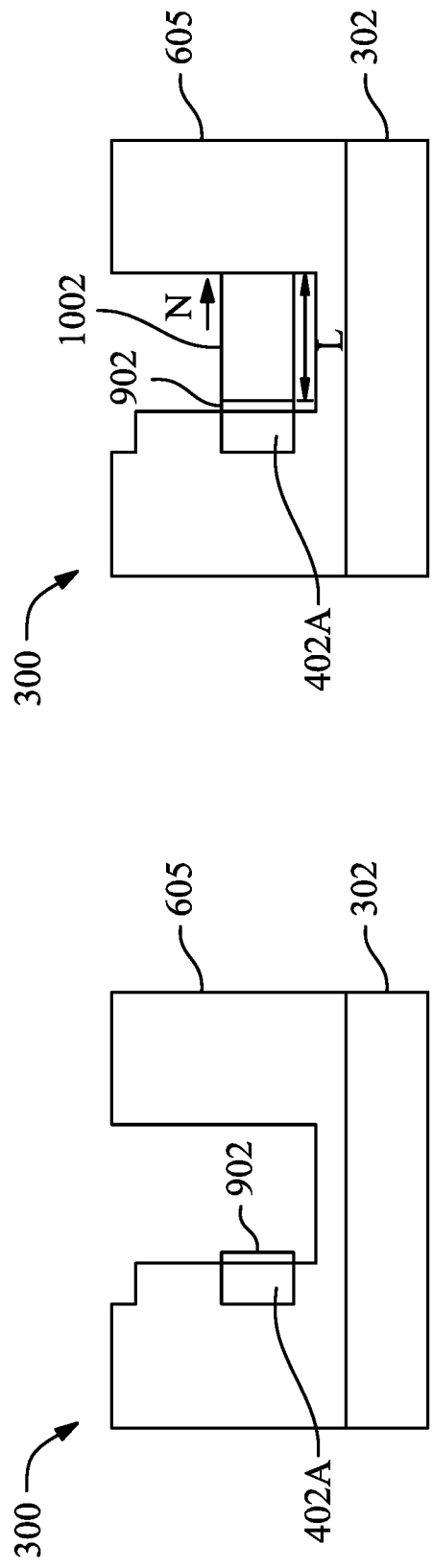

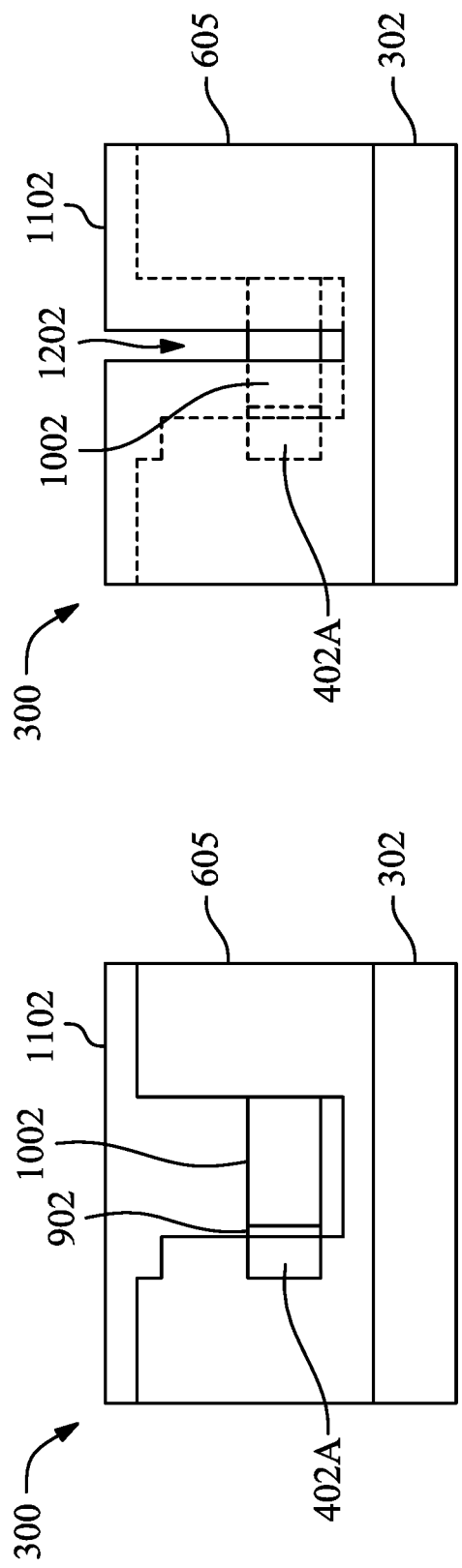
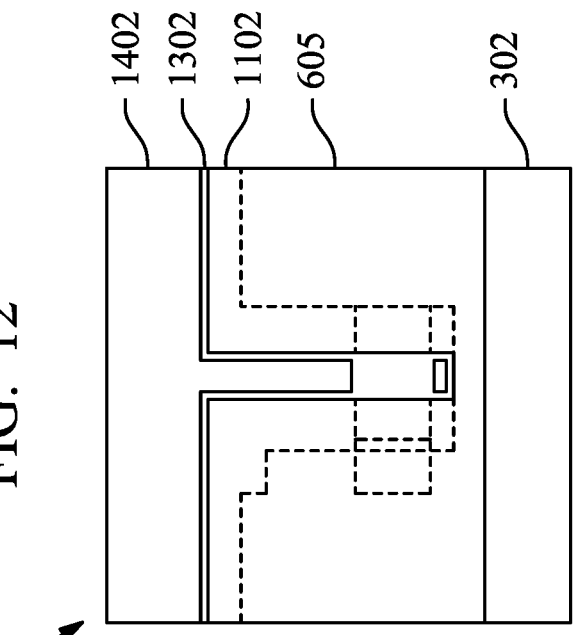
FIG. 12
FIG. 11
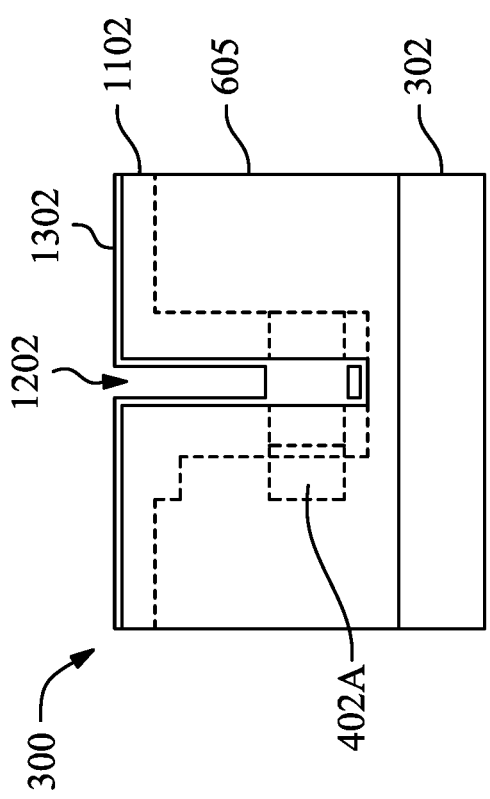
FIG. 14
FIG. 13

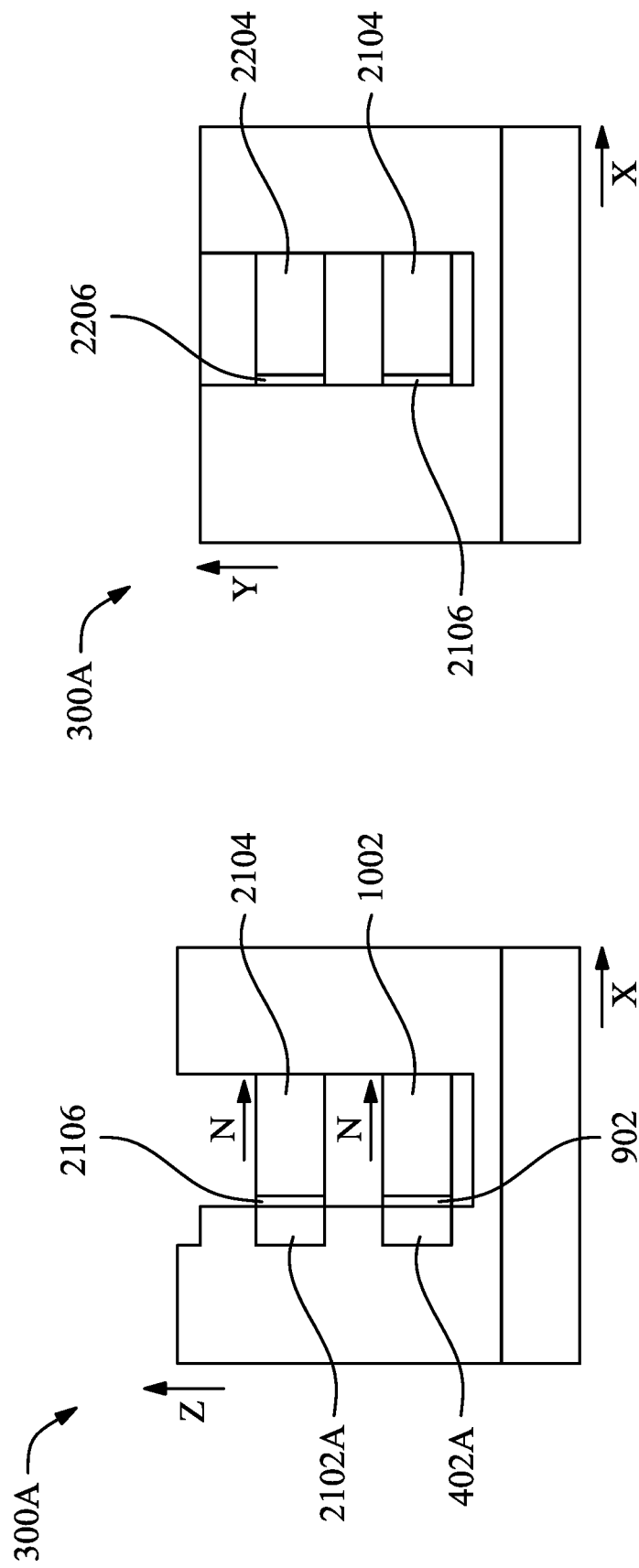

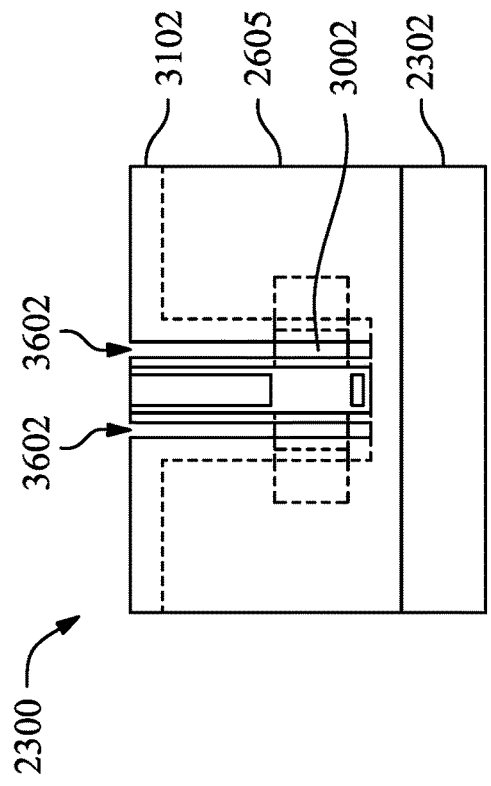
FIG. 35
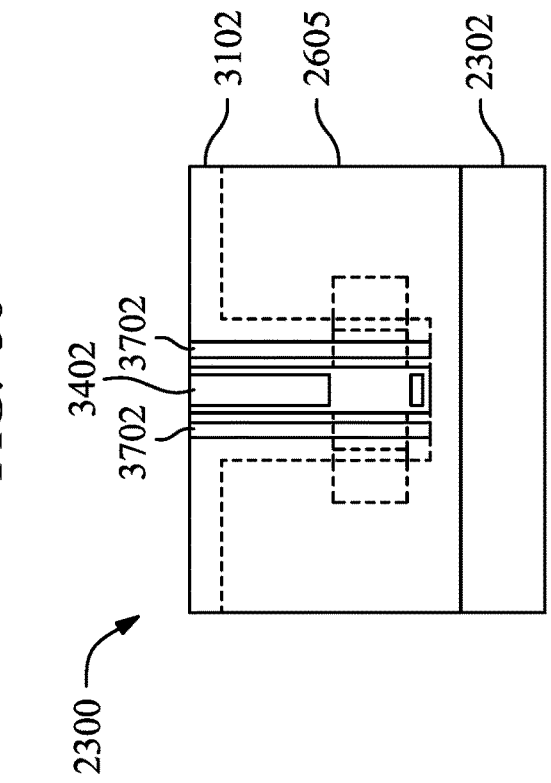
FIG. 36
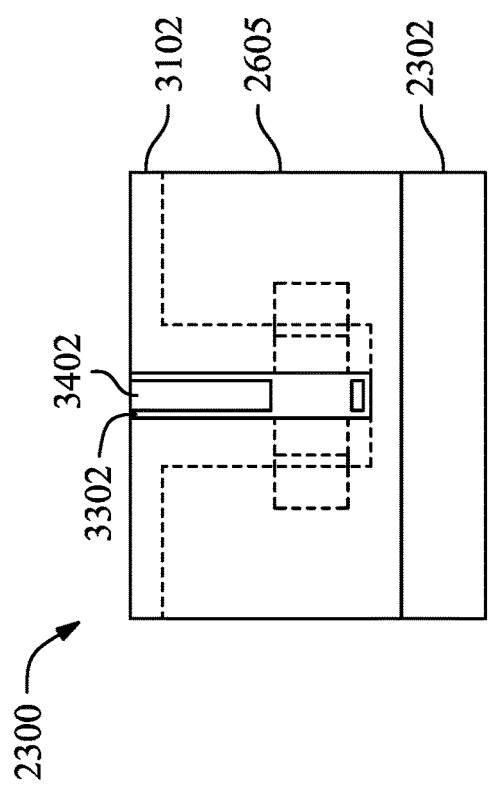
FIG. 37
FIG. 38

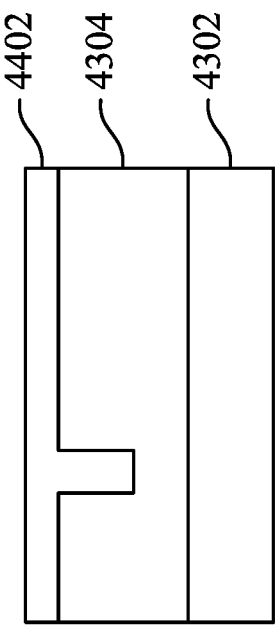
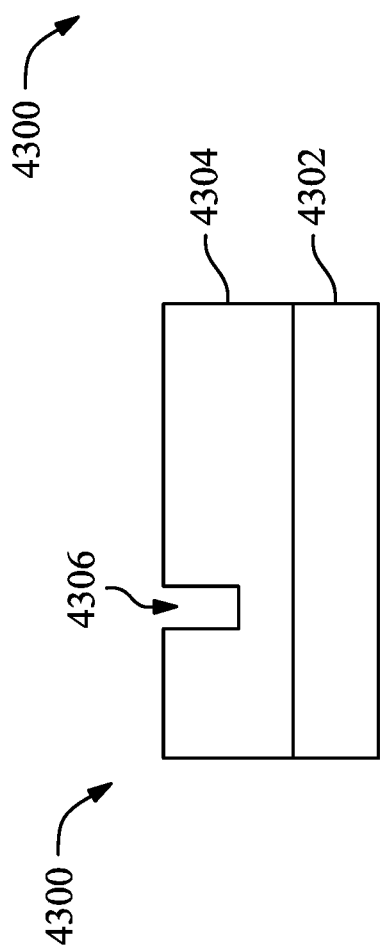
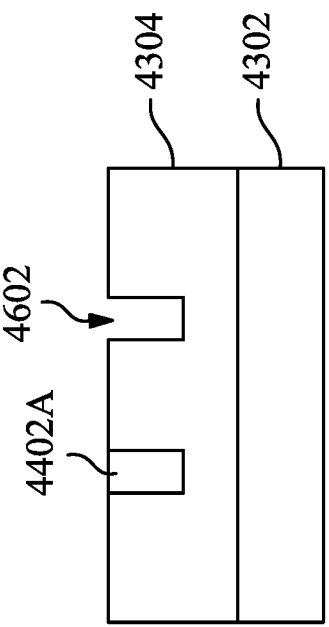
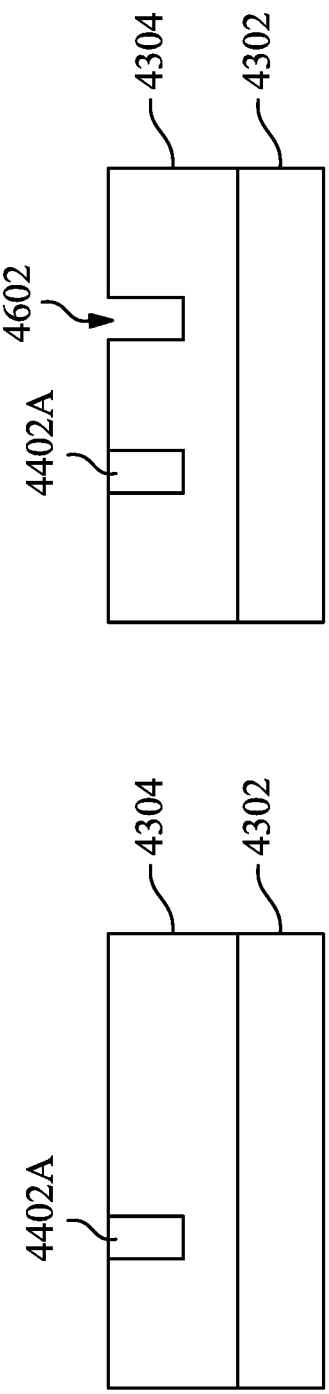

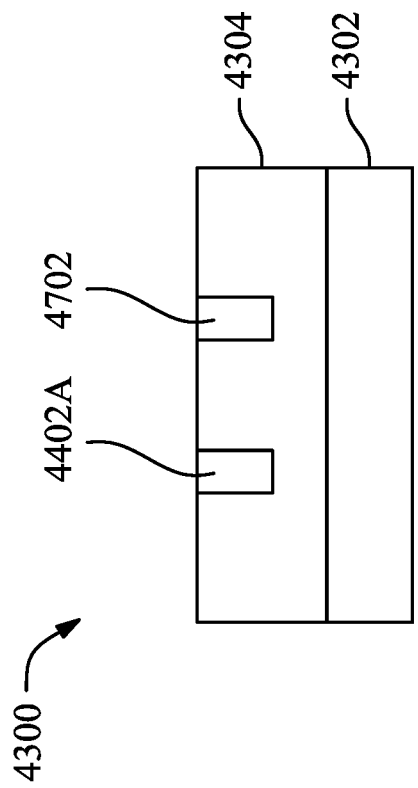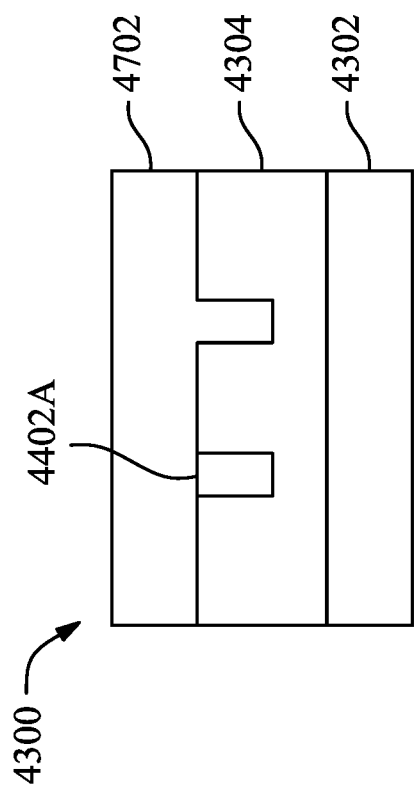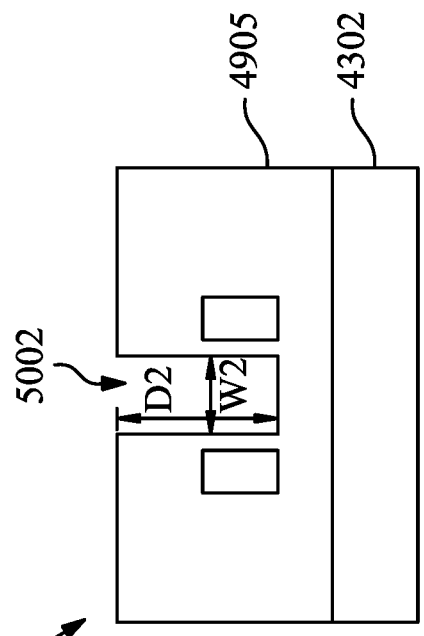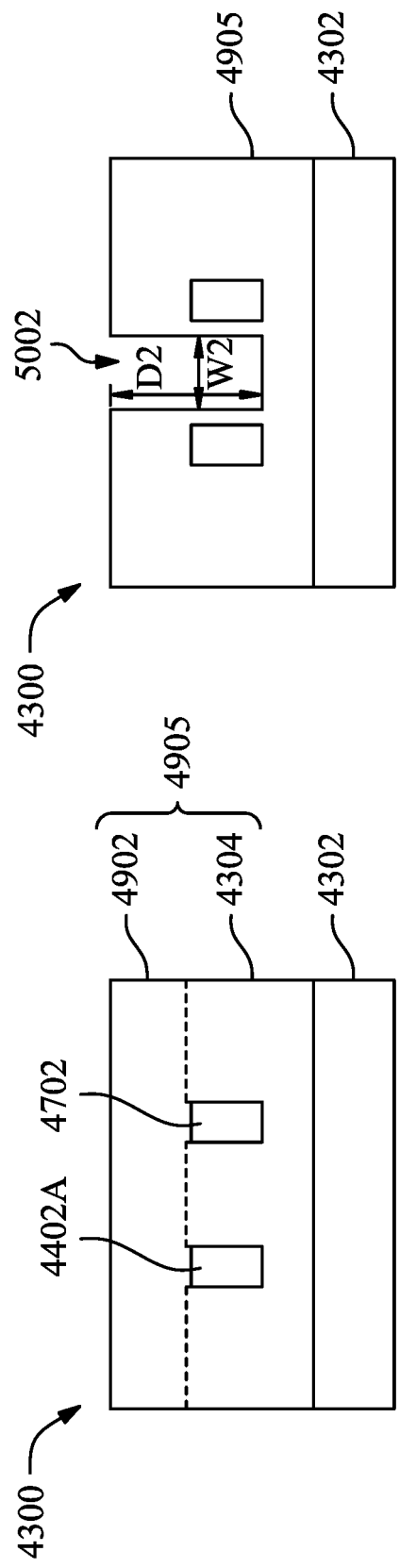

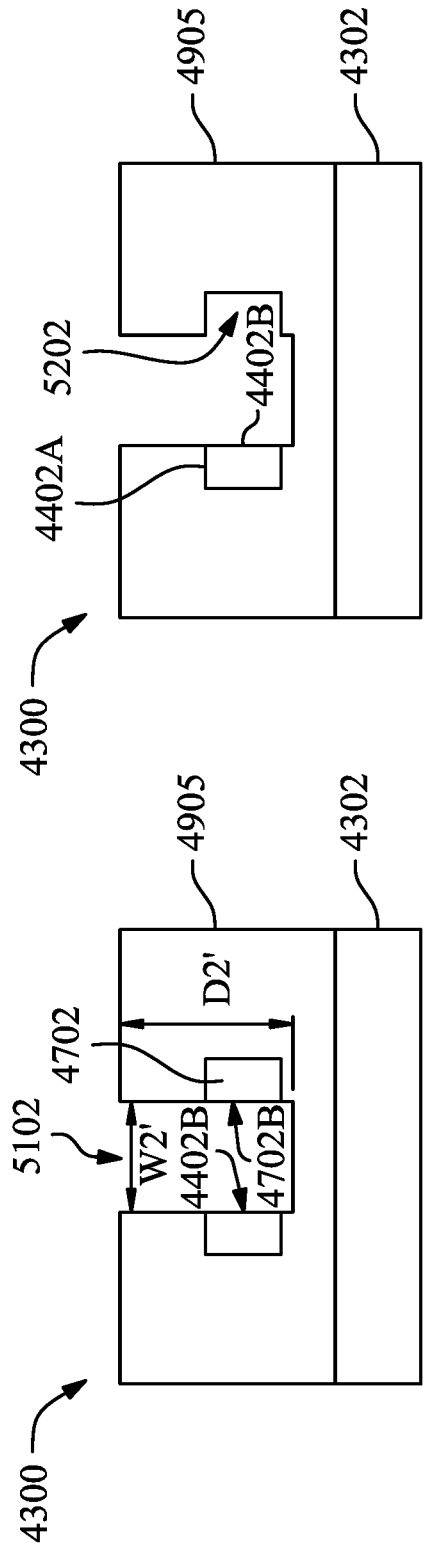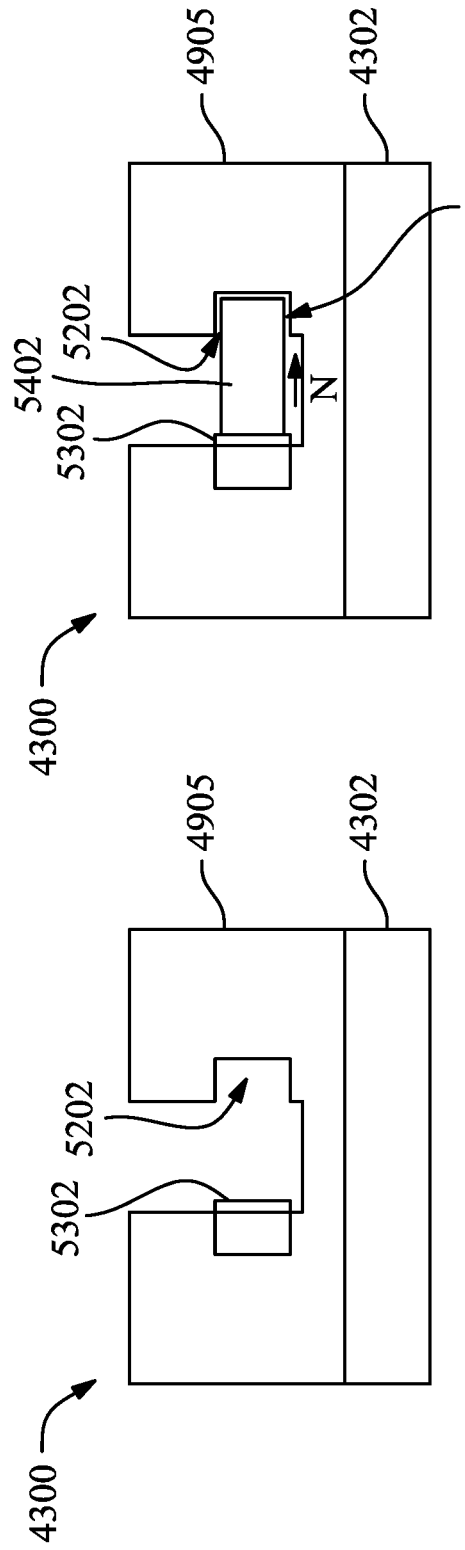

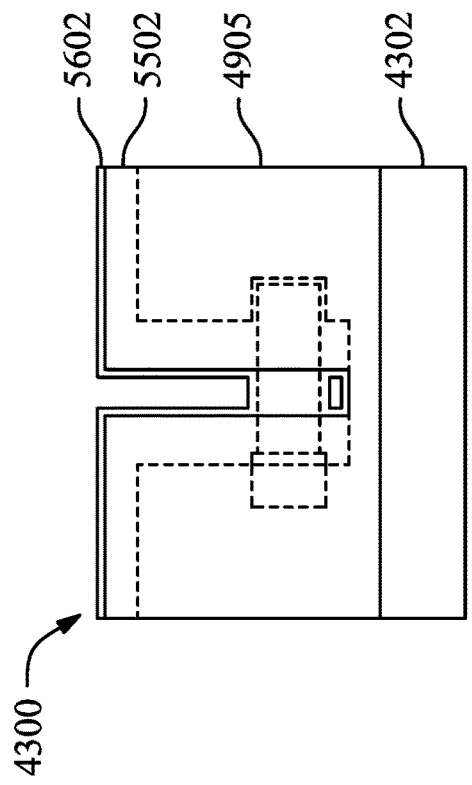
FIG. 56
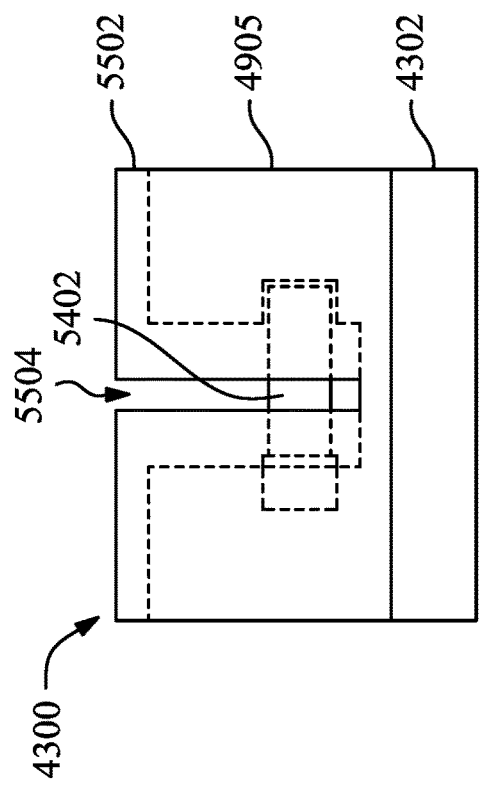
FIG. 55
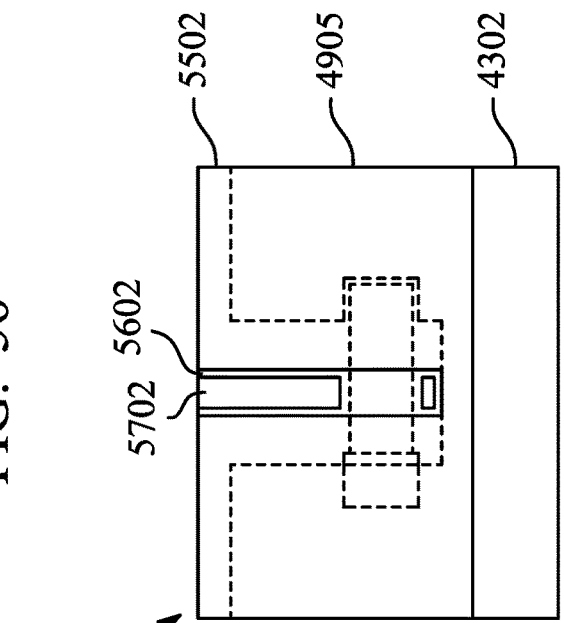
FIG. 58
FIG. 57

US 10,854,724 B2

ONE-DIMENSIONAL NANOSTRUCTURE GROWTH ON GRAPHENE AND DEVICES THEREOF

PRIORITY DATA

The present application is a continuation application of U.S. patent application Ser. No. 15/652,001, which will issue as U.S. Pat. No. 10,134,865, which is a divisional patent application of U.S. patent application Ser. No. 15/130,527 filed on Apr. 15, 2016, now U.S. Pat. No. 9,711,607, the disclosures of which are hereby incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, multi-gate device structures such as gate-all-around (GAA) structures have been introduced in an effort to provide improved gate-to-channel coupling (e.g., for improved gate control), as well as reduced OFF-state current and reduced short-channel effects (SCEs). In at least some cases, GAA structures have been implemented with the use of III-V (e.g., InGaAs, InAs, etc.) nanowire structures. In some examples, a top-down approach is used where a III-V channel material is grown on a lattice-matched substrate, followed by lithography and selective etching. However, because of the large lattice and thermal mismatch between III-V materials and silicon, direct growth of a III-V material on silicon is quite difficult. Alternatively, in some cases, selective area growth may be used to grow nanowires on a silicon substrate. However, in such examples, the growth direction of the nanowires is limited by the underlying substrate orientation. Moreover, in some cases and based on the nature of the substrate, nanowires may inadvertently grow in more than one direction, making single-direction growth difficult. Further, some current methods include nanowire growth followed by manual nanowire transfer to a desired location on a substrate. Such a technique is not suitable for mass production.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A/1B illustrate examples of a vertical and a horizontal GAA device, respectively;

FIGS. 3-19 illustrate cross sectional views of embodiments of a GAA device, where nanobar growth proceeds according to a one-sided nanobar growth process, and corresponding to one or more steps of the method of FIGS. 2A/2B;

FIGS. 21 and 22 illustrate a cross sectional and top-down view, respectively, of embodiments of a GAA device, including a plurality of nanobars formed according to a one-sided nanobar growth process, and corresponding to one or more steps of the method of FIGS. 2A/2B;

FIGS. 23-39 illustrate cross sectional views of embodiments of a GAA device, where nanobar growth proceeds according to a two-sided nanobar growth process, and corresponding to one or more steps of the method of FIGS. 2A/2B;

FIGS. 43-62 illustrate cross sectional views of embodiments of a GAA device, including a supporting cavity, and corresponding to one or more steps of the method of FIGS. 42A/42B;

DETAILED DESCRIPTION

Figure 2A:
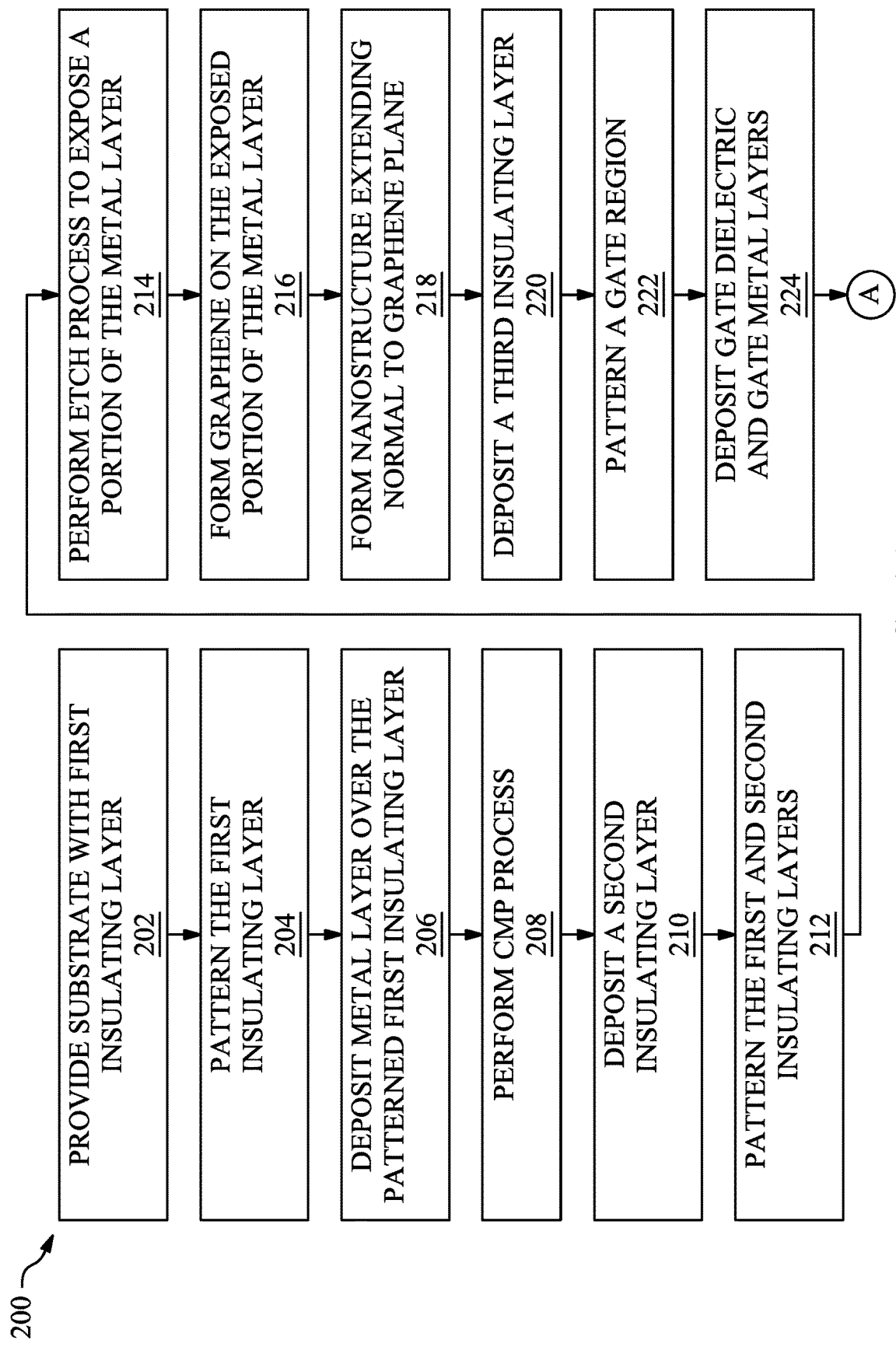
FIGS. 2A/2B provide a flow chart of a method of fabricating a GAA device according to one or more aspects of the present disclosure.
Figure 2B:
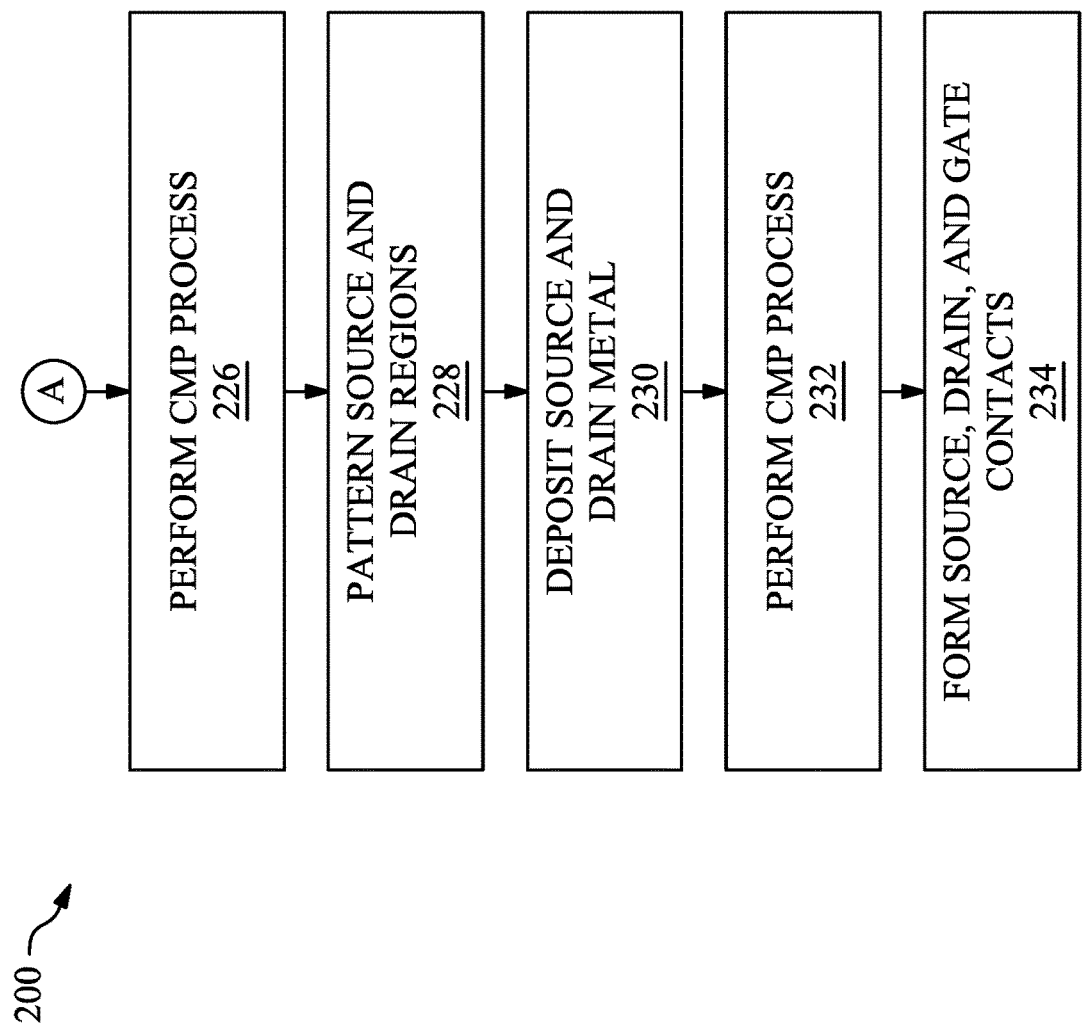

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors referred to herein as gate-all-around (GAA) devices or surrounding gate devices. Such a device may include a P-type device or an N-type device. The multi-gate device disclosed herein may include any of a variety of one-dimensional nanostructures such as nanorods, nanowires, nanopillars, or nanobars. In the discussion that follows, the terms "nanorod", "nanowire", "nanopillars", and "nanobars" may be used interchangeably. Moreover, while a particular term may be used to describe a given embodiment (e.g., for clarity of discussion), the embodiment is not meant to be limited to the term used. One of ordinary skill may recognize other embodiments of semiconductor devices (e.g. carbon nanotubes) that may benefit from aspects of the present disclosure.

Illustrated in FIGS. 1A and 1B are examples of a vertical and a horizontal GAA device, respectively. The device structures of FIGS. 1A/1B are only briefly described for the purpose of providing context and clarity to the discussion that follows. Referring first to FIG. 1A a vertical GAA device 100 may include a nanowire 102 grown on a substrate 104 (e.g., a silicon substrate). The device 100 may further include a source region 106, a drain region 108, and a gate structure 110 surrounding a channel region of the nanowire 102 and that interposes the source and drain regions 106, 108. In an example, when the nanowire 102 includes a III-V material, and when the substrate includes silicon, the growth direction of the nanowire 102 may be limited by the substrate 104 orientation. Moreover, lattice and thermal mismatch between the nanowire 102 and the substrate 104 make growth of the nanowire difficult and may degrade the device 100. Horizontal GAA device 150 of FIG. 1B may similarly include a nanowire 152, a source region 156, a drain region 158, and a gate structure 160 surrounding a channel region of the nanowire 152 and that interposes the source and drain regions 156, 158. In some cases, the device 150 may be formed using a top-down approach where a III-V channel material is grown on a lattice-matched substrate, followed by lithography and selective etching. Alternatively, the device 150 may be formed by nanowire growth and subsequent manual nanowire transfer to a desired location on a substrate, which is not suitable technique for mass production.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for forming nanobars (or other one-dimensional nanostructures such as nanowires, nanopillars, or nanorods) on a substrate, where the nanobar growth direction is independent of the underlying substrate orientation. In various embodiments, such substrate-orientation-independent nanobar growth is achieved by the use of an intermediate graphene layer, which serves as a template for nanobar growth. Graphene, as described herein, refers to a two-dimensional (2-D) sheet of carbon atoms bonded to one another in a hexagonal crystal lattice. In addition, as used herein, the term "graphene" may include monolayer graphene, bilayer graphene, or multi-layer graphene (e.g., including more than two layers). Compared to III-V materials and silicon, III-V materials and graphene have a comparatively smaller lattice mismatch, making graphene an attractive growth template for III-V nanostructures. In various embodiments, III-V nanobar growth proceeds in a direction normal to the 2-D plane of the graphene layer. As a result, the nanobar growth direction can be controlled merely by the intermediate graphene layer, and the graphene layer itself may be placed or grown on any suitable substrate (e.g., not limited to silicon, or to a particular silicon orientation). Thus, the nanobar growth direction remains independent of the underlying substrate (e.g., the substrate on which the graphene layer is disposed). Such decoupling of nanostructure growth from the underlying substrate opens up new opportunities for GAA device fabrication. For example, in various embodiments described herein, horizontal III-V nanobars suitable for GAA devices may be achieved without lithography and etching (e.g., as in some conventional top-down techniques), and/or without nanobar/nanowire growth and manual transfer (e.g., as in at least some conventional bottom-up techniques), as described above. In some cases, the graphene used as the template for III-V nanobar growth may additionally serve as a transparent and flexible electrode. Generally, embodiments described herein provide for a simple and inexpensive way to provide nanobars disposed in a direction that is free from substrate orientation and which overcomes significant shortcomings of at least some current techniques.

Figure 20B:
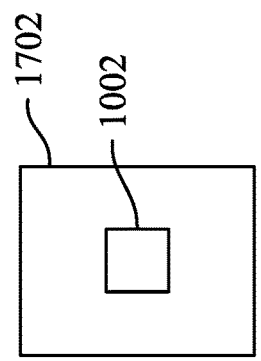
FIG. 20B illustrates a view of a source/drain region of a GAA device taken along section B-B' of FIG. 19, in accordance with some embodiments.
Figure 20A:
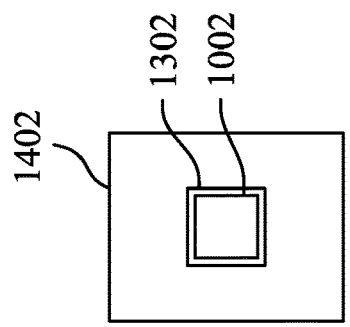
FIG. 20A illustrates a view of a gate region of a GAA device taken along section A-A' of FIG. 19, in accordance with some embodiments.
Figure 19:
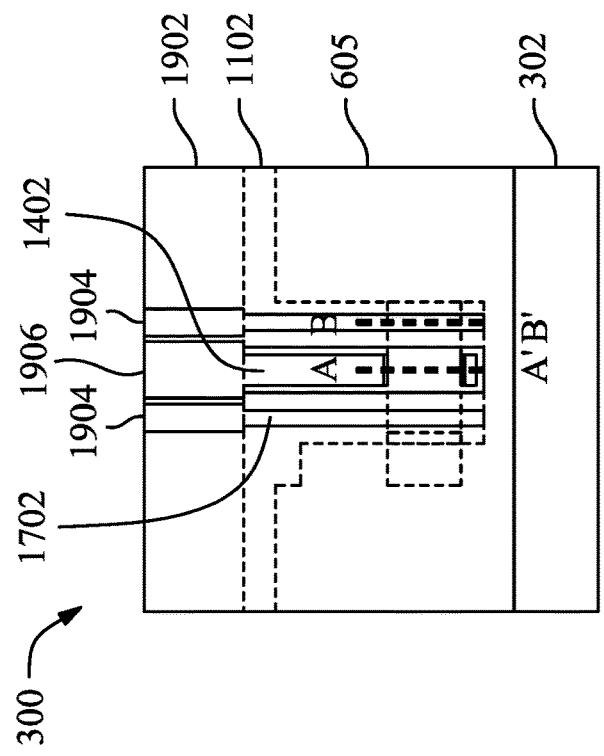
Figure 24:
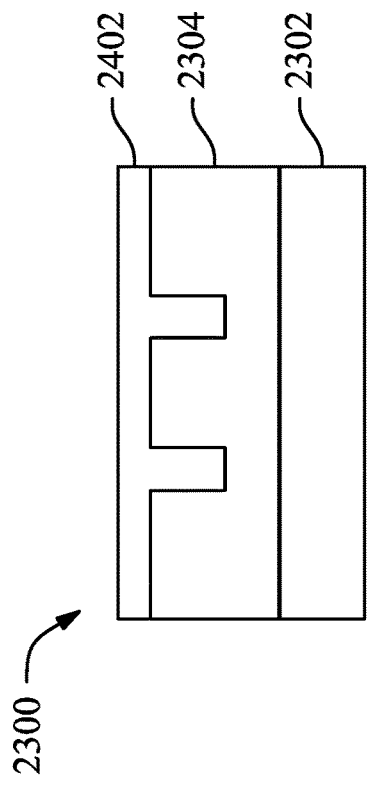

Referring now to FIGS. 2A/2B, illustrated is a flow chart of a method 200 of fabricating a GAA device according to one or more aspects of the present disclosure. The method 200 may be used to provide GAA devices including one or more nanostructures (e.g., nanobars, nanowires, etc.) which are grown in a direction that is independent of an underlying substrate, as discussed above. In particular, the method 200 may be used to provide GAA devices including one or more horizontal nanobars, where nanobar growth proceeds according to a one-sided nanobar growth process. FIGS. 3-19 are cross sectional views of embodiments of a GAA device 300 according to one or more aspects of the present disclosure and corresponding to one or more steps of the method 200 of FIGS. 2A/2B. FIG. 20A illustrates a view along section A-A' of FIG. 19, and FIG. 20B illustrates a view along section B-B' of FIG. 19. FIGS. 21 and 22 illustrate a cross sectional and top-down view, respectively, of embodiments of a GAA device 300A, including a plurality of nanobars, and fabricated according to one or more steps of the method 200 of FIGS. 2A/2B. Additional embodiments of structures and methods in accordance with the present disclosure are discussed in more detail with reference to FIGS. 23-65 below.

It is understood that parts of the method 200 and/or the GAA devices 300, 300A may be fabricated by a well-known complementary metal-oxide-semiconductor (CMOS) technology process flow, and thus some processes are only briefly described herein. In addition, the GAA device 300A may share aspects of the GAA device 300, thus some aspects and/or processes of the GAA device 300A are only discussed briefly for purposes of clarity in understanding. Further, the GAA devices 300, 300A may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the GAA devices 300, 300A includes a plurality of GAA devices (e.g., transistors), which may be interconnected.

In various embodiments, the GAA devices 300, 300A may be intermediate devices fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. In some embodiments, the GAA devices 300, 300A may be formed over a substrate having a dielectric layer disposed thereon, where the substrate may include CMOS transistors (or other devices mentioned above) formed within the substrate, and where electrodes of the GAA devices 300, 300A and electrodes of devices within the substrate may be connected through the dielectric layer by way of one or more contacts, vias, or other electrical interconnects.

Referring now to the method 200, the method 200 begins at block 202 where a substrate having a first insulating layer is provided. Referring to the example of FIG. 3, and in an embodiment of block 202, illustrated therein is a device 300 including a substrate 302. In some embodiments, the substrate 302 may be a semiconductor substrate such as a silicon substrate. In some embodiments, the substrate 302 may include various layers, including conductive or insulating layers formed on a semiconductor substrate. In some examples, the substrate 302 may include various doping configurations depending on design requirements as is known in the art. In some embodiments, the substrate 302 may also include other semiconductors such as germanium, silicon carbide (SiC), silicon germanium (SiGe), or diamond. Alternatively, in some embodiments, the substrate 302 may include a compound semiconductor and/or an alloy semiconductor. Further, in some embodiments, the substrate 302 may include an epitaxial layer (epi-layer), the substrate 302 may be strained for performance enhancement, the substrate 302 may include a silicon-on-insulator (SOI) structure, and/or the substrate 302 may have other suitable enhancement features. In a further embodiment of block 202, an insulating layer 304 may be formed over the substrate 302. For example, the insulating layer 304 may include a $SiO_2$ layer grown by thermal oxidation over the substrate 302. However, other types of oxide layers (e.g., $Al_2O_3$) and/or other methods of oxide deposition may be used (e.g., CVD, ALD) without departing from the scope of the present disclosure.

After formation of the insulating layer 304, the method 200 then proceeds to block 204 where the first insulating layer is patterned. Still referring to the example of FIG. 3, and in an embodiment of block 204, the insulating layer 304 is patterned. In some embodiments, photolithography and etching processes may be performed to pattern the insulating layer 304. The photolithography process may include forming a photoresist layer (resist) over the insulating layer 304, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the insulating layer 304 while an etch process forms at least one recess 306 within the insulating layer 304, thereby providing a patterned insulating layer. In various examples, the etch process include a dry etch (e.g., chemical oxide removal), a wet etch, and/or other suitable processes.

The method 200 then proceeds to block 206 where a metal layer is formed over the patterned first insulating layer. Referring to the example of FIG. 4, and in an embodiment of block 206, a metal layer 402 is formed over the patterned first insulating layer 304, filling the at least one recess 306. In various embodiments, the metal layer 402 may include Ni, Cu, Pt, Fe, Co, Au, Ru, Ir, Pd, a Cu—Ni alloy, a Ni—Au alloy, or combinations thereof. In some embodiments, the metal layer 402 serves to facilitate chemical vapor deposition (CVD)-growth of graphene by way of catalyzed decomposition of hydrocarbons on a surface of the metal layer 402, as discussed below. In various embodiments, the metal layer 402 may be formed using PVD, CVD, ALD, electron beam (e-beam) evaporation, and/or other suitable process.

The method 200 then proceeds to block 208 where a chemical mechanical polishing (CMP) process is performed. Referring to the example of FIGS. 4 and 5, and in an embodiment of block 208, a CMP process is performed which removes a portion of the metal layer 402 over the insulating layer 304, while at least some metal (e.g., a metal portion 402A) of the metal layer 402 remains within the recess 306. Thus, after the CMP process of block 208, the GAA device 300 includes the metal portion 402A formed within the recess 306 of the patterned insulating layer 304.

The method 200 then proceeds to block 210 where a second insulating layer is deposited. Referring to the example of FIGS. 5 and 6, and in an embodiment of block 210, an insulating layer 604 may be formed over the insulating layer 304 and over the metal portion 402A. In some embodiments, the insulating layer 604 may be substantially the same as the insulating layer 304, such that the stacked insulating layers 304/604 effectively form a contiguous, composite insulating layer. However, in some cases, the insulating layer 604 may be different than the insulating layer 304. For example, in some cases, the insulating layer 604 may be deposited by a lower temperature process (e.g., as compared to the insulating layer 304), so as not to disrupt the metal portion 402A. In some embodiments, even if the insulting layer 604 is different than the insulating layer 304, the stacked insulating layers 304/604 may be considered as a contiguous, composite insulating layer. For clarity of illustration and discussion, the stacked insulating layers 304/604 may be equivalently referred to as composite insulating layer 605, as shown in FIG. 6.

The method 200 then proceeds to block 212 where the first and second insulating layers are patterned. Referring to the example of FIG. 7, and in an embodiment of block 212, the first and second insulating layers 304/604 (e.g., the composite insulating layer 605) are patterned. In some embodiments, photolithography and etching processes may be performed to pattern the composite insulating layer 605, similar to the method used to pattern the first insulating layer, described above in block 204. In various embodiments, the patterning of the first and second insulating layers of block 212 is done to form at least one recess 702, having a depth D and a width W, within the composite insulating layer 605, thereby patterning the first and second insulating layers 304/604.

The method 200 then proceeds to block 214 where an etching process is performed to expose a portion of the metal layer. Referring to the example of FIGS. 7 and 8, and in an embodiment of block 214, an isotropic etching process of the composite insulating layer 605 is performed which increases the depth and width of the recess 702. In some embodiments, the isotropic etching process of block 214 includes a wet chemical etch that is selective with respect to the metal portion 402A. Thus, in various examples, the etching process may etch the composite insulating layer 605 without etching the metal portion 402A. In some embodiments, the etching process of block 214 may result in a recess 802, having a depth D' greater than D and a width W' greater than W. Moreover, the etching process of block 214 may be result in exposure of a lateral surface 402B of the metal portion 402A. As discussed below, the exposed lateral surface 402B of the metal portion 402A may serve to facilitate the CVD-growth of graphene by way of catalyzed decomposition of hydrocarbons on the surface 402B.

After exposure of the surface 402B of the metal portion 402A, the method 200 then proceeds to block 216 where graphene is formed on the exposed surface 402B. Referring to the example of FIGS. 8 and 9, and in an embodiment of block 216, a graphene layer 902 is formed on the surface 402B of the metal portion 402A. In addition, the graphene layer 902 may define a vertical plane parallel to the surface 402B. As described above, the metal layer 402 may include Ni, Cu, Pt, Fe, Co, Au, Ru, Ir, Pd, a Cu—Ni alloy, a Ni—Au alloy, or combinations thereof, thus the metal portion 402A may likewise include one of the same materials. In various embodiments, the graphene layer 902 may include monolayer graphene, bilayer graphene, or multi-layer graphene (e.g., including more than two layers). By way of example, formation of the graphene layer 902 may be accomplished by a CVD-based method. In CVD-based methods, precursor gases, which may include one or more of a hydrocarbon (e.g., methane, ethylene, acetylene, or other appropriate hydrocarbon) and hydrogen gas, are introduced into a processing chamber housing the GAA device 300. In various embodiments, the hydrocarbon is decomposed on the surface 402B of the metal portion 402A, where the metal catalyzes the decomposition process, enabling graphene growth either by a combination of surface nucleation and two-dimensional growth, or by a surface segregation process of carbon from the metal portion 402A. In some embodiments, prior to the graphene growth, the GAA device 300 may be annealed (e.g., in a hydrogen gas ambient) in order to increase a metal grain size of the metal portion 402A. Additionally, in some embodiments, after graphene formation, the GAA device 300 may be annealed (e.g., in a hydrogen and/or nitrogen atmosphere) in order to clean a surface of the formed graphene layer 902. As discussed below, the graphene layer 902 formed at block 216 serves as a template for subsequent nanobar growth.

The method 200 then proceeds to block 218 where a nanostructure is formed extending in a direction normal to the graphene plane. Referring to the example of FIGS. 9 and 10, and in an embodiment of block 218, a nanobar 1002 is formed on the graphene layer 902, where growth of the nanobars proceeds in a direction N that is normal to the vertical plane defined by the graphene layer 902, where the graphene layer 902 is used as a growth-template for growth of the nanobar 1002. While nanorod growth is described, embodiments disclosed herein may apply equally to the formation of other one-dimensional nanostructures such as nanowires, nanopillars, or nanobars, which may be grown using the graphene layer 902 as a growth-template. As previously discussed, III-V materials on graphene have a comparably smaller lattice mismatch as compared to III-V materials on silicon, making graphene an attractive growth template for III-V nanostructures. As shown, and in some embodiments, the nanobar 1002 may have a length L equal to about the width W' of the recess 802, minus the thickness of the graphene layer 902 (e.g., around 0.35 nanometers for monolayer graphene). By way of example, formation of the nanobar 1002 may be accomplished by a variety of methods such as metal-organic CVD (MOCVD), molecular beam epitaxy (MBE), or another appropriate method as known in the art. In some embodiments, the nanobar 1002 may include an InGaAs nanobar (or InGaAs nanorod/nanowire/nanopillar), an InAs nanobar (or InAs nanorod/nanowire/nanopillar), a GaAs nanobar (or GaAs nanorod/nanowire/nanopillar), or other III-V nanostructure as known in the art, as well as a silicon nanobar (or Si nanorod/nanowire/nanopillars) or germanium nanobar (or Ge nanorod/nanowire/nanopillar). In at least some examples, the nanobar 1002 may include a core-shell structure, for example, having an InAs core and a InGaAs shell. In some cases, the nanobar 1002 may include a core-multishell structure, for example, having a InGaAs core, an InP barrier layer surrounding the InGaAs core, an InAlAs/δ-doping/InAlAs multilayer surrounding the InP barrier layer, and an InGaAs outer shell layer surrounding the InAlAs/δ-doping/InAlAs multilayer. While a few examples of III-V nanostructures have been given which may be used to form the nanobar 1002, those of skill in the art in possession of this disclosure will recognize other III-V nanostructures that may equally be employed without departing from the scope of the present disclosure.

The method 200 then proceeds to block 220 where a third insulating layer is deposited. Referring to the example of FIGS. 10 and 11, and in an embodiment of block 220, an insulating layer 1102 may be formed over the composite insulating layer 605 and over the nanobar 1002. In some embodiments, the insulating layer 1102 may be substantially the same as the insulating layer 605, such that the insulating layer 1102 and insulating layer 605 effectively form a contiguous, composite insulating layer. However, in some cases, the insulating layer 1102 may be different than the insulating layer 605. In some embodiments, even if the insulting layer 1102 is different than the insulating layer 605, the stacked insulating layers 1102/605 may be considered as a contiguous, composite insulating layer.

The method 200 then proceeds to block 222 where a gate region is patterned. Referring to the example of FIGS. 11 and 12, and in an embodiment of block 222, the insulating layer 1102 is patterned. In some embodiments, photolithography and etching processes may be performed to pattern the insulating layer 1102, similar to the method used to pattern the first insulating layer, described above in block 204. In various embodiments, the patterning of the insulating layer of block 222 is done to form a recess 1202, thereby exposing a portion of the nanobar 1002, where the exposed region of the nanobar 1002 includes a gate region of the GAA device 300.

The method 200 then proceeds to block 224 where gate dielectric and gate metal layers are deposited. Referring to the example of FIGS. 13 and 14, and in an embodiment of block 224, a gate dielectric layer 1302 is formed over the device 300. In various embodiments, the dielectric layer 1302 may be deposited over, and surrounding, the nanobar 1002 in the exposed gate region, as well as along sidewalls of the recess 1202, and over the insulating layer 1102 (e.g., outside the recess 1202), as shown in FIG. 13. In various embodiments, the dielectric layer 1302 may include a high-K dielectric layer, or in some cases may include a high-K layer formed over an interfacial layer. High-K dielectrics, as used and described herein, include dielectric materials having a high dielectric constant, for example, greater than that of thermal silicon oxide (~3.9). In some embodiments, the interfacial layer (if present) may include a dielectric material such as $SiO_2$, HfSiO, or SiON. In various embodiments, the high-K dielectric layer of the dielectric layer 1302 may include a dielectric layer such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. Each of the interfacial layer and the high-K dielectric layer of the dielectric layer 1302 may be formed by ALD, physical vapor deposition (PVD), CVD, chemical oxidation, thermal oxidation, and/or other suitable methods. In some examples, a nucleation and/or functionalization layer (or nucleation/functionalization treatment) may be formed (or performed) prior to formation of the dielectric layer 1302 in order to enable the deposition of the dielectric layer 1302, and interfacial layer (if present), onto the nanobar 1002.

Referring to the example of FIG. 14, and in a further embodiment of block 224, after formation of the dielectric layer 1302, a gate metal layer 1402 is formed. In various embodiments, the metal layer 1402 may be deposited over, and surrounding, the dielectric layer 1302 in the gate region of the nanobar 1002. By way of example, in some embodiments, the gate metal layer 1402 may include a conductive layer such as W, TiN, TaN, WN, Re, Ir, Ru, Mo, Al, Cu, Co, Ni, Cr, Ti, Au, Pd, Ag, Pt, Fe, combinations thereof, and/or other suitable compositions. In some embodiments, the gate metal layer 1402 may alternately include a polysilicon layer. The gate metal layer 1402 may be formed using PVD, CVD, ALD, electron beam (e-beam) evaporation, and/or other suitable process. In some examples, the gate metal layer 1402 may be formed using a metal lift-off process.

The method 200 then proceeds to block 226 where a CMP process is performed. Referring to the example of FIGS. 14 and 15, and in an embodiment of block 226, a CMP process is performed which removes portions of the gate metal layer 1402 and portions of the dielectric layer 1302 over the insulating layer 1102 (e.g., outside the recess 1202), while portions of the gate metal layer 1402 and the dielectric layer 1302 remain within the recess 1202. In addition, the CMP process of block 226 may substantially planarize a top surface of the GAA device 300.

The method 200 then proceeds to block 228 where source and drain regions are patterned. Referring to the example of FIGS. 15 and 16, and in an embodiment of block 228, the insulating layer 1102 is patterned. In some embodiments, photolithography and etching processes may be performed to pattern the insulating layer 1102, similar to the method used to pattern the first insulating layer, described above in block 204. In various embodiments, the patterning of the insulating layer of block 228 is done to form recesses 1602, thereby exposing portions of the nanobar 1002 adjacent to and on either side of the gate region, where the regions of the nanobar 1002 exposed by the recesses 1602 include source and drain regions of the GAA device 300.

The method 200 then proceeds to block 230 where source and drain metal is deposited. Referring to the examples of FIGS. 16 and 17, after patterning the source/drain regions and forming the recesses 1602, a source and drain metal layer 1702 may be formed. In various embodiments, the metal layer 1702 may be deposited over the GAA device 300, and in particular the metal layer 1702 may be deposited over, and surrounding, the nanobar 1002 on the exposed source/drain regions within the recesses 1602, as shown in FIG. 17. In some embodiments, the source/drain metal layer 1702 may include a conductive layer such as Cr, Ti, Au, Ni, Pd, Ir, Ag, Pt, Cu, Co, Al, Fe, combinations thereof, and/or other suitable compositions. In various embodiments, the source/drain metal layer 1702 may be formed using PVD, CVD, ALD, electron beam (e-beam) evaporation, and/or other suitable process. In some examples, the source/drain metal layer 1702 may be formed using a metal lift-off process.

The method 200 then proceeds to block 232 where a CMP process is performed. Referring to the example of FIGS. 17 and 18, and in an embodiment of block 232, a CMP process is performed which removes a portion of the source/drain metal layer 1702, while portions of the source/drain metal layer 1702 remain within the recesses 1602. In addition, the CMP process of block 232 may substantially planarize a top surface of the GAA device 300.

The method 200 then proceeds to block 234 source, drain, and gate contacts are formed. Referring to the example of FIGS. 18 and 19, and in an embodiment of block 234, a dielectric layer 1902 is formed over the device 300. In some embodiments, the dielectric layer 1902 includes silicon oxide, silicon oxynitride, a low-K dielectric material or other suitable dielectric material. In some embodiments, the dielectric layer 1902 may include a single layer or multiple layers. By way of example, the dielectric layer 1902 may be formed by any of a plurality of suitable techniques including CVD, ALD, and spin-on techniques (e.g., for depositing spin-on-glass). In some embodiments, a CMP process may be performed thereafter to remove excess material from the ILD layer 1902 and planarize the top surface of the device 300. In a further embodiment of block 234, source, drain, and gate contact openings are formed within the dielectric layer 1902 to provide access to the source/drain metal layer 1702 and to the gate metal layer 1402. By way of example, the source, drain, and gate contact openings may be formed by a suitable combination of lithographic patterning and etching (e.g., wet or dry etching) processes. Thereafter, and in a further embodiment of block 234, metal source/drain contacts 1904 and a metal gate contact 1906 are formed within the contact openings. By way of example, the source/drain contacts 1904 contact the source/drain metal layer 1702, and the metal gate contact 1906 contacts the gate metal layer 1402. In various embodiments, each of the source/drain contacts 1904 and the gate contact 1906 may include a conductive layer such as Cr, Ti, Au, Ni, Pd, Ir, Ag, Pt, Cu, Co, Al, Fe, combinations thereof, and/or other suitable compositions. Additionally, each of the source/drain contacts 1904 and the gate contact 1906 may be formed using PVD, CVD, ALD, electron beam (e-beam) evaporation, and/or other suitable process, for example, such as a metal lift-off process. In some embodiments, the source/drain contacts 1904 and the gate contact 1906 are composed of the same material(s). However, in some embodiments, the source/drain contacts 1904 and the gate contact 1906 are composed of different materials. In some embodiments, a CMP process may be performed after formation of the source/drain contacts 1904 and the gate contact 1906 to remove excess material and planarize the top surface of the device 300.

The device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more GAA devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, the GAA device 300 may be formed over a substrate having a dielectric layer disposed thereon, where the substrate may include CMOS transistors (or other devices mentioned above) formed within the substrate, and where electrodes of the GAA device 300 (e.g., source/drain electrodes) and electrodes of devices within the substrate may be connected through the dielectric layer by way of one or more contacts, vias, or other electrical interconnects. Moreover, additional process steps may be implemented before, during, and after the method 200, and some process steps described above may be replaced or eliminated in accordance with various embodiments of the method 200.

To further illustrate the structure of the GAA device 300, reference is now made to FIGS. 20A and 20B. Referring first to FIG. 20A, illustrated therein is a view of the gate region of the device 300 taken along section A-A' of FIG. 19, showing the nanobar 1002 surrounded by the gate dielectric layer 1302, and further showing the gate dielectric layer 1302 surrounded by the gate metal layer 1402. Referring to FIG. 20B, illustrated therein is a view of a source/drain region of the device 300 taken along section B-B' of FIG. 19, showing the nanobar 1002 surrounded by the source/drain metal layer 1702.

With reference now to FIGS. 21 and 22, illustrated therein are a cross-sectional and top-down view, respectively, of a GAA device 300A, including a plurality of nanobars 1002, 2104, according to one or more aspects of the present disclosure. In various embodiments, the GAA device 300A may be processed in a manner substantially similar to the GAA device 300 described above with respect to the method 200. By way of illustration, and with reference first to FIG. 21, after formation of the metal portion 402A and the insulating layer 604, as shown in FIG. 6, one or more of the steps of the method 200 may be repeated so as to build up a structure (e.g., in a vertical direction, Z) including the plurality of nanobars 1002, 2104. As merely one example and beginning with the structure of FIG. 6, another insulating layer may be deposited and patterned (e.g., as in blocks 202, 204), another metal layer may be deposited, a CMP process performed, and an additional insulating layer deposited (e.g., as in blocks 206, 208, 210), resulting in another metal portion 2102A. Thereafter, after suitable patterning and etching processes (e.g., as in blocks 212, 214), surfaces of the metal portions 402A, 2102A are exposed, both of which may serve to facilitate CVD-growth of graphene, as described above. Accordingly, the graphene layer 902 and a graphene layer 2106 may be formed on the exposed surfaces of each of the metal portions 402A and 2102A, respectively (e.g., as in block 216), and the nanobars 1002 and 2104 may be formed, where growth of the nanobars proceeds in a direction N normal to the plane of the graphene layers 902 and 2106, similar to the method described above (e.g., as in block 218). Additional processing may be performed, for example, including patterning and formation of gate dielectric and gate metal layers, source/drain metal layers, and source, drain, and gate contacts.

Referring to the top-down view of the GAA device 300A of FIG. 22, illustrated therein is the graphene layer 2106 and the nanobar 2104, described above. FIG. 22 also shows a graphene layer 2206 and a nanobar 2204, which may be formed similarly to the nanobars 1002 or 2104. Moreover, the nanobar 2204 may be in the same horizontal plane as either one of the nanobars 1002 or 2104. More broadly, FIG. 22 illustrates that one or more of the steps of the method 200 may be repeated so as to build up a structure in a horizontal direction Y (e.g., in addition to or alternatively to building up the structure in the vertical direction, Z). Thus, the GAA device 300A of FIGS. 21 and 22 provides a structure having a plurality of nanobars, where the plurality of nanobars may form an array that extends along one or both of a horizontal and a vertical direction.

Figure 41:
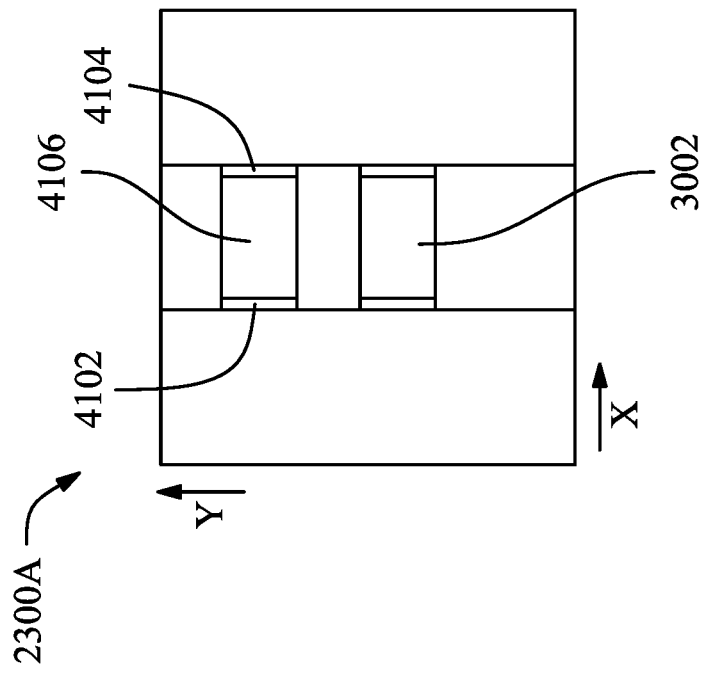
FIGS. 40 and 41 illustrate a cross sectional and top-down view, respectively, of embodiments of a GAA device, including a plurality of nanobars formed according to a two-sided nanobar growth process, and corresponding to one or more steps of the method of FIGS. 2A/2B.

Referring to FIGS. 23-39, illustrated therein are cross-sectional views of embodiments of a GAA device 2300 according to one or more aspects of the present disclosure and corresponding to one or more steps of the method 200. Additionally, FIGS. 40 and 41 illustrate a cross sectional and top-down view, respectively, of embodiments of a GAA device 2300A, including a plurality of nanobars, and fabricated according to one or more steps of the method 200. In various embodiments, aspects of the GAA device 2300 may be formed in a manner similar to the GAA device 300 described above with respect to the method 200 and FIGS. 3-19, and aspects of the GAA device 2300A may be formed in a manner similar to the GAA device 300A described above with respect to the method 200 and FIGS. 21 and 22. However, while FIGS. 3-19 and FIGS. 21-22 illustrate nanobar growth that proceeds according to a one-sided nanobar growth process, the examples of FIGS. 23-39 and FIGS. 40-41 illustrate nanobar growth which proceeds according to a two-sided nanobar growth process. Furthermore, for clarity of discussion, aspects and/or processes shown in the examples of FIGS. 23-39 and FIGS. 40-41 which are substantially the same as those already described above are only discussed briefly, while additional discussion is reserved to highlight differences of the two-sided nanobar growth process.

Figure 23:
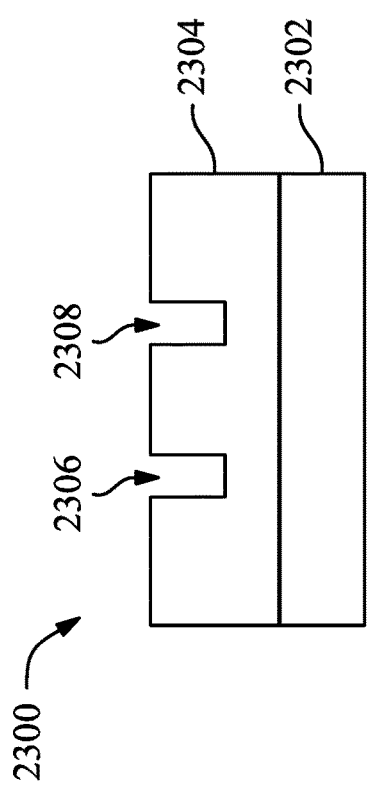

Referring first to the example of FIG. 23, and in an embodiment of block 202 of the method 200, illustrated therein is the device 2300 including a substrate 2302 and having an insulating layer 2304 formed over the substrate 2302. In various embodiments, the substrate 2302 may be substantially the same as the substrate 302 described above with reference to the device 300, and the insulating layer 2304 may be substantially the same as the insulating layer 304 described above with reference to the device 300.

After formation of the insulating layer 2304, and in an embodiment of block 204 of the method 200, the insulating layer 2304 is patterned. As shown in the example of FIG. 23, and in at least some aspects similar to the example of FIG. 3, patterning of the insulating layer 2304 results in the formation of recesses 2306 and 2308 within the insulating layer 2304, thereby providing a patterned insulating layer.

Figure 25:
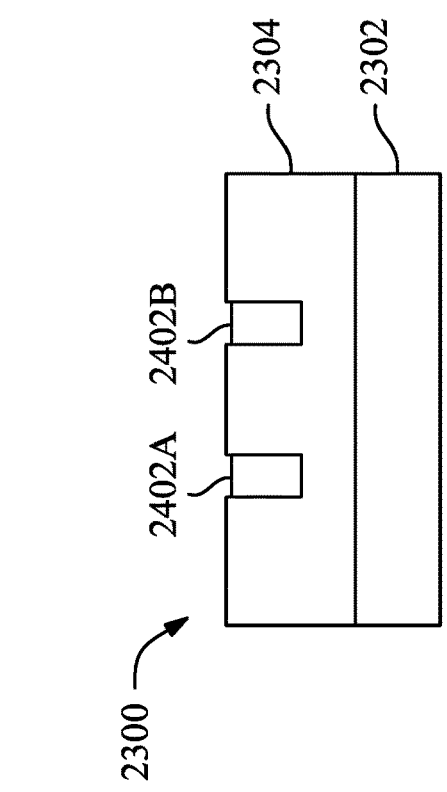

Thereafter, in an embodiment of block 206 of the method 200, a metal layer is formed over the patterned insulating layer (e.g., patterned insulating layer 2304). Referring to the example of FIG. 24, and in at least some aspects similar to the example of FIG. 4, a metal layer 2402 is formed over the patterned insulating layer 2304, filling the recesses 2306, 2308. In various embodiments, the metal layer 2402 may be substantially the same as the metal layer 402 described above with reference to the device 300. Referring to FIG. 25, and in an embodiment of block 208, a CMP process is performed, which may result in metal portions 2402A and 2402B formed within the recesses 2306, 2308 of the patterned insulating layer 2304.

Figure 26:
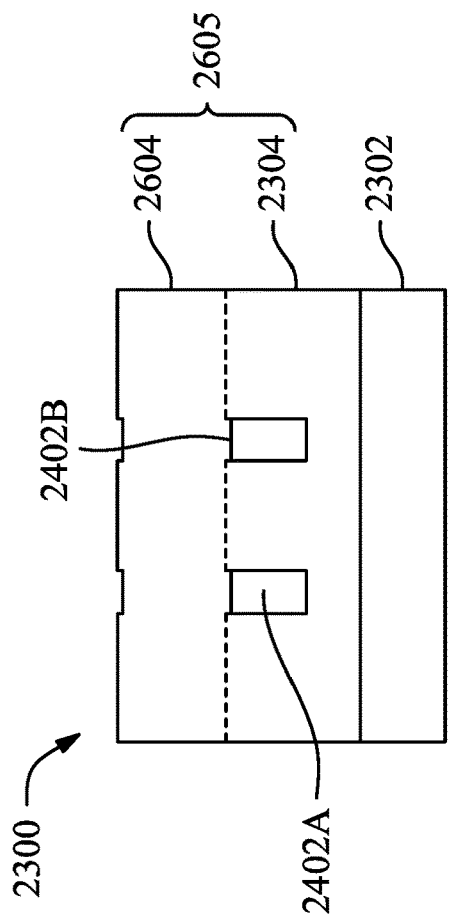

Referring to the example of FIG. 26, in an embodiment of block 210 and in at least some aspects similar to the example of FIG. 6, an insulating layer 2604 may be formed over the insulating layer 2304 and over the metal portions 2402A and 2402B. In some embodiments, the stacked insulating layers 2304/2604 may be substantially the same as the stacked insulating layers 304/604 described above with reference to the device 300. Additionally, for clarity of discussion, the stacked insulating layers 2304/2604 may be equivalently referred to as composite insulating layer 2605, as shown in FIG. 26.

Figure 27:
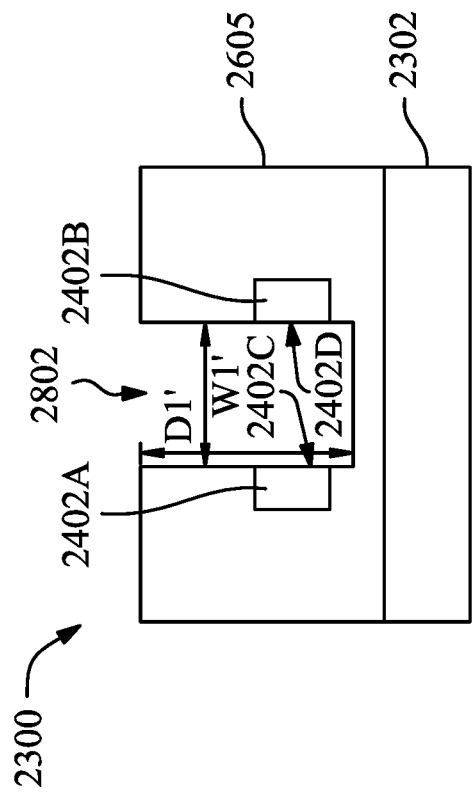

With reference to the example of FIG. 27, in an embodiment of block 212 and in at least some aspects similar to the example of FIG. 7, the stacked insulating layers 2304/2604 (e.g., the composite insulating layer 2605) are patterned. Patterning of the composite layer 2605 results in a recess 2702, having a depth D1 and a width W1, within the composite insulating layer 2605, thereby patterning the stacked first and second insulating layers 2304/2604.

Figure 28:
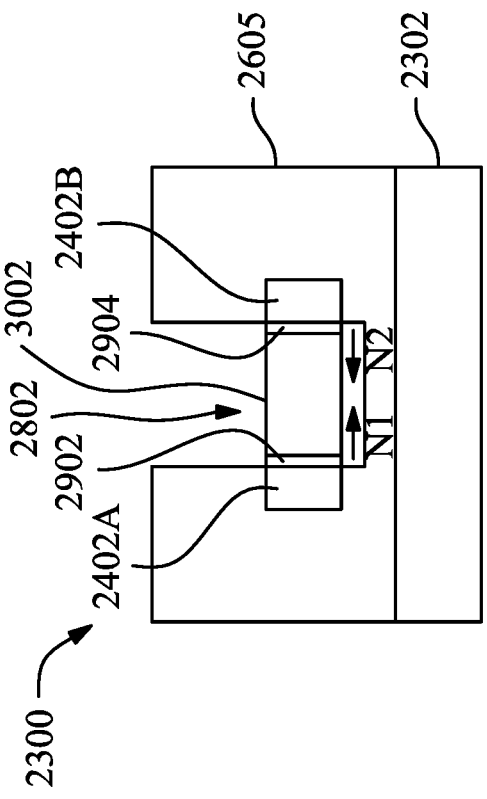

In an embodiment of block 214, and with reference to the example of FIGS. 27 and 28, an etching process (e.g., an isotropic etching process) of the composite insulating layer 2605 is performed which increases the depth and width of the recess 2702. For example, the etching process may result in a recess 2802, having a depth D1' greater than D1 and a width W1' greater than W1. Moreover, the etching process results in exposure of a surface 2402C of the metal portion 2402A and a surface 2402D of the metal portion 2402B. Similar to the exposed surface 402B discussed above with reference to the device 300, the exposed surfaces 2402C and 2402D may serve to facilitate the CVD-growth of graphene by way of catalyzed decomposition of hydrocarbons on the surfaces 2402C and 2402D.

Figure 29:
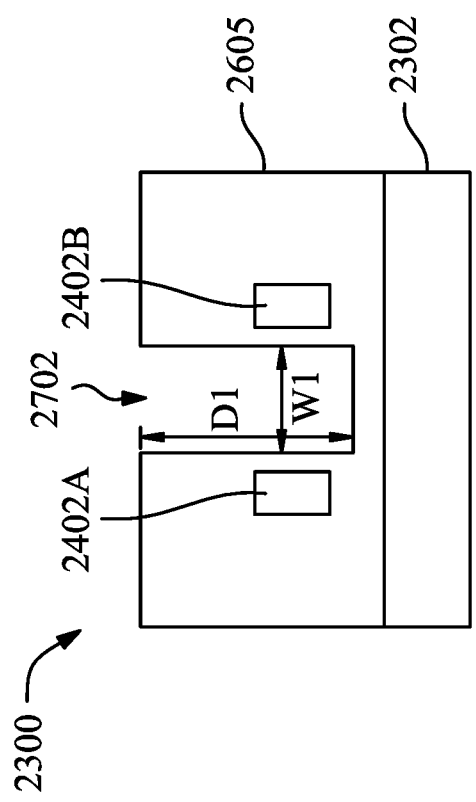

After exposure of the surfaces 2402C and 2402D, in an embodiment of block 216 and in at least some aspects similar to the example of FIG. 9, graphene is formed on the exposed surfaces 2402C and 2402D. For example, a graphene layer 2902 is formed on the surface 2402C of the metal portion 2402A, and a graphene layer 2904 is formed on the surface 2402D of the metal portion 2402B, as shown in FIG. 29. In addition, the graphene layer 2902 may define a vertical plane parallel to the surface 2402C, and the graphene layer 2904 may define a vertical plane parallel to the surface 2402D. In various embodiments, formation of the graphene layers 2902 and 2904 may be substantially the same as formation of the graphene layer 902, discussed above with reference to the device 300. In addition, optional treatments (e.g., annealing) of the metal portions 2402A, 2402B (e.g., prior to graphene growth) or of the subsequently formed graphene layers 2902, 2904, may also be performed, as discussed above with reference to the device 300. It is noted that as the graphene layer 902 of the device 300 serves as a template for one-sided nanobar growth, the graphene layers 2902 and 2904 of the device 2300 serve as templates for two-sided nanobar growth. In some embodiments, a nanobar formed using the two-sided nanobar growth process described herein (e.g., nanobar 3002, FIG. 30) may have more mechanical strength and be more structurally stable than a nanobar formed using a one-sided nanobar growth process.

Figure 30:
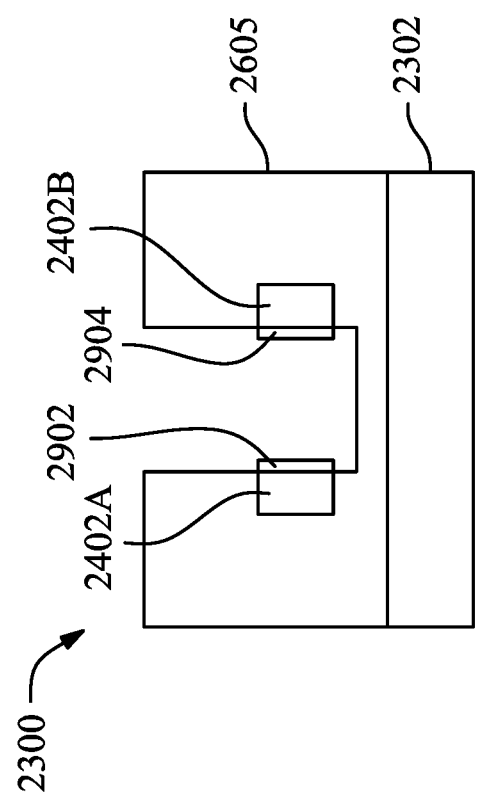

Referring to the example of FIGS. 29 and 30, in an embodiment of block 218 and in at least some aspects similar to the example of FIG. 10, a nanobar 3002 is formed. In some embodiments, the nanobar 3002 may be formed by a merging and/or connection of two separate nanobars, where growth of each of the two separate nanobars proceeds from each of the graphene layers 2902 and 2904. By way of example, a first nanobar may form in a direction N1 that is normal to the vertical plane defined by the graphene layer 2902, and a second nanobar may form in a direction N2 that is normal to the vertical plane defined by the graphene layer 2904. Thus, in this example, the two separate nanobars grow in a direction towards one another, due to planes of the graphene layers 2902, 2904 being oriented in directly opposing directions. In various embodiments, the two separate nanobars merge and/or connect within the recess 2802 to form the nanobar 3002, where the nanobar 3002 may be referred to as a "composite nanobar". In various cases, and for example depending on a growth rate of each of the two separate nanobars forming from each of the two separate graphene layers 2902, 2904, the two nanobars may connect/merge at any of a variety of positions between the graphene layers 2902, 2904 within the recess 2802 to form the nanobar 3002. Thus, in some cases, the nanobar 3002 may include two nanobar segments of different lengths. However, in some examples, the growth rate of each of the two separate nanobars forming from each of the two separate graphene layers 2902, 2904 may be substantially the same, such that the two nanobars connect/merge midway between the opposing graphene layers 2902, 2904. Therefore, in some cases, the nanobar 3002 may include two nanobar segments of substantially the same length. In various embodiments, formation of each of the two separate nanobars, resulting in the formation of the nanobar 3002, may be substantially the same as formation of the nanobar 1002, discussed above with reference to the device 300. In addition to nanorod growth, the graphene layers 2902, 2904 may equally be used as growth templates for the formation of other one-dimensional nanostructures such as nanowires, nanopillars, or nanobars.

Figure 31:
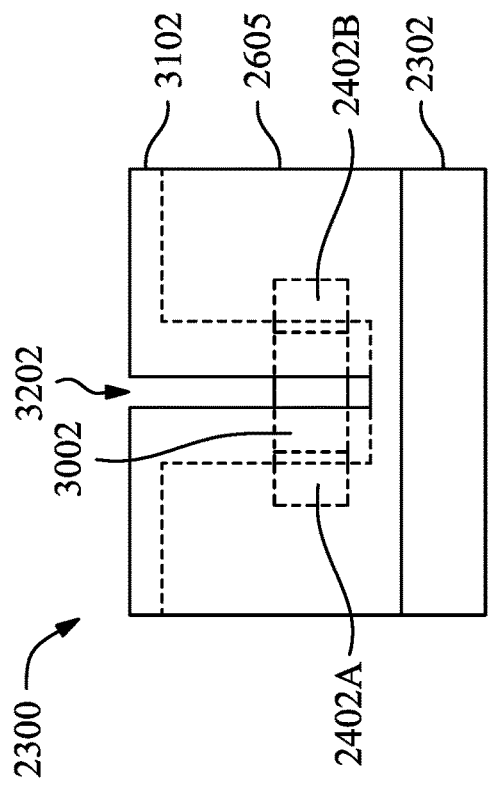

After formation of the nanobar 3002, in an embodiment of block 220 and in at least some aspects similar to the example of FIG. 11, an insulating layer 3102 may be formed over the composite insulating layer 2605 and over the nanobar 3002, as shown in FIG. 31. In various embodiments, formation of the insulating layer 3102 may be substantially the same as formation of the insulating layer 1102, discussed above with reference to the device 300.

Figure 32:
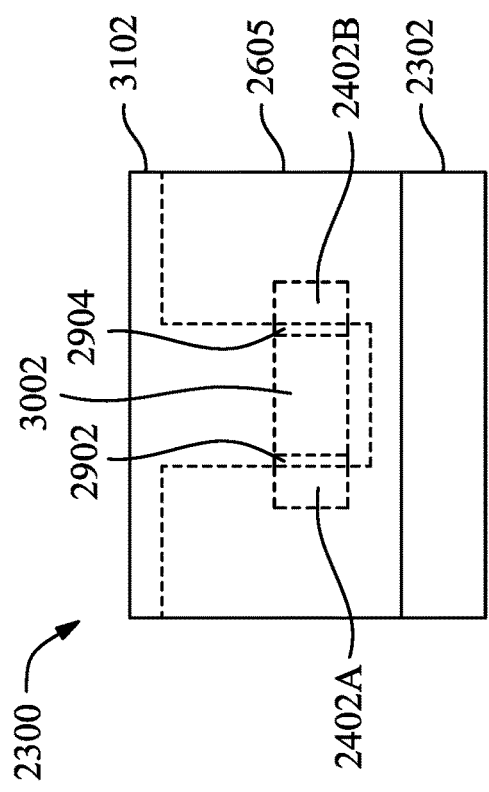

Referring to FIG. 32, in an embodiment of block 222 and in at least some aspects similar to the example of FIG. 12, a gate region is patterned within the insulating layer 3102. In various embodiments, the patterning of the insulating layer 3102 may be substantially the same as the patterning of the insulating layer 1102, discussed above with reference to the device 300. Moreover, the patterning of the insulating layer 3102 is done to form a recess 3202, thereby exposing a portion of the nanobar 3002, where the exposed region of the nanobar 3002 includes a gate region of the GAA device 2300.

Figure 33:
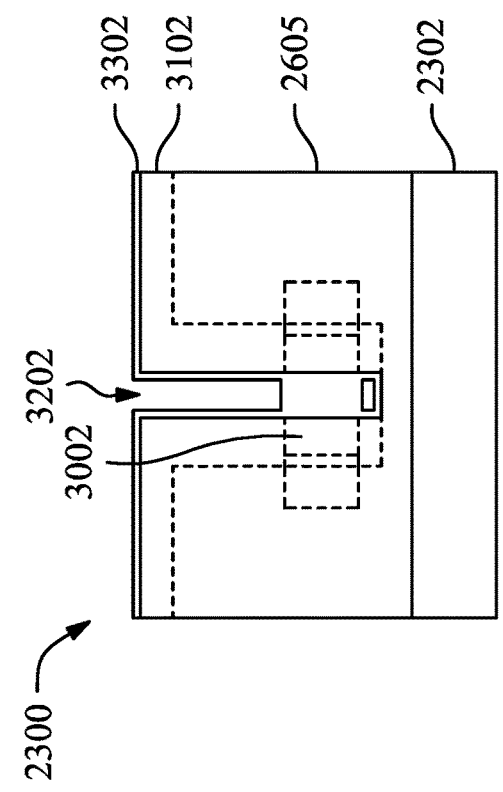
Figure 34:
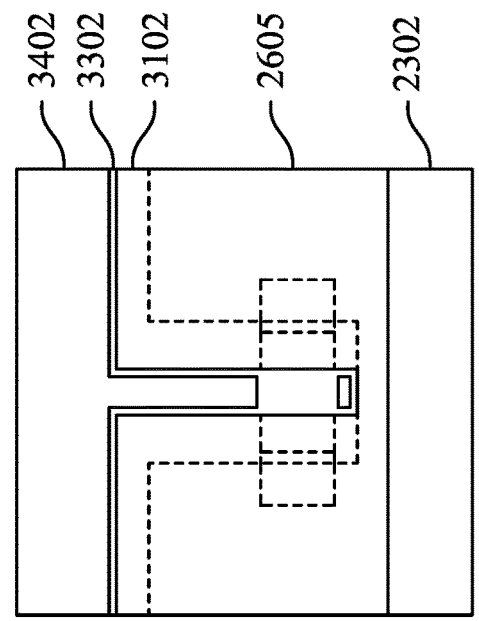

With reference to FIGS. 33 and 34, in an embodiment of block 224 and in at least some aspects similar to the example of FIGS. 13 and 14, a gate dielectric layer 3302 is formed over the device 2300 (e.g., over, and surrounding, the exposed gate region of the nanobar 3002), and a metal layer 3402 is formed over, and surrounding, the dielectric layer 3302 in the gate region of the nanobar 3002. In various embodiments, the formation of the gate dielectric layer 3302 and the metal layer 3402 may be substantially the same as the formation of the gate dielectric layer 1302 and the metal layer 1402, discussed above with reference to the device 300.

Figure 15:
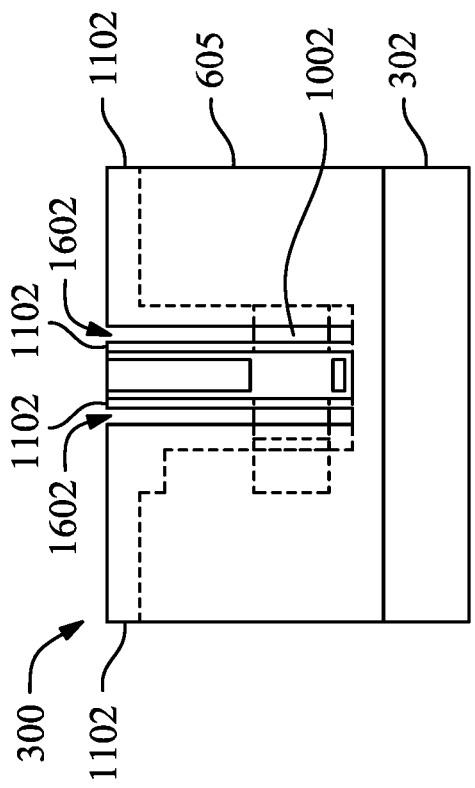

Referring to FIG. 35, in an embodiment of block 226 and in at least some aspects similar to the example of FIG. 15, a CMP process is performed which removes excess portions of the gate metal layer 3402 while substantially planarizing a top surface of the GAA device 2300.

Figure 16:
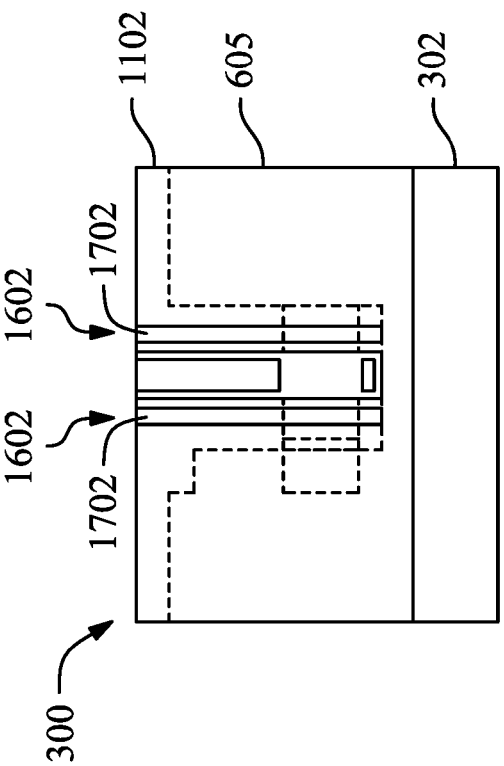
Figure 17:
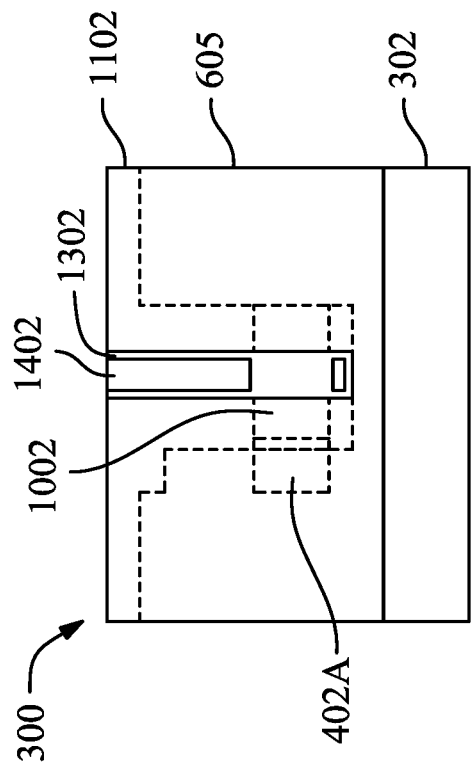
Figure 18:
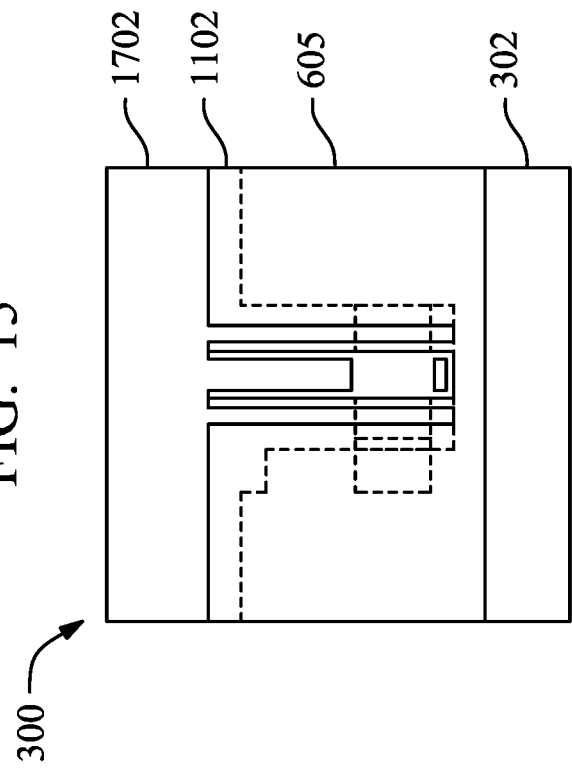

Thereafter, with reference to FIG. 36, in an embodiment of block 228 and in at least some aspects similar to the example of FIG. 16, source and drain regions are patterned within the insulating layer 3102. By way of example, the patterning of the insulating layer 3102 is done to form recesses 3602, thereby exposing portions of the nanobar 3002 adjacent to and on either side of the gate region, where the regions of the nanobar 3002 exposed by the recesses 3602 include source and drain regions of the GAA device 2300.

As shown in the example of FIG. 37, and in an embodiment of block 230, a source and drain metal layer 3702 may be formed. In various embodiments, formation of the source and drain metal layer 3702 may be substantially the same as the formation of the source and drain metal layer 1702, discussed above with reference to the device 300. In particular, the metal layer 3702 may be deposited over, and surrounding, the exposed source/drain regions of the nanobar 3002 within the recesses 3602, as shown in FIG. 37.

Thereafter, as shown in FIG. 38, and in an embodiment of block 232, a CMP process is performed which removes excess portions of the source/drain metal layer 3702, while substantially planarizing a top surface of the GAA device 2300.

Figure 39:
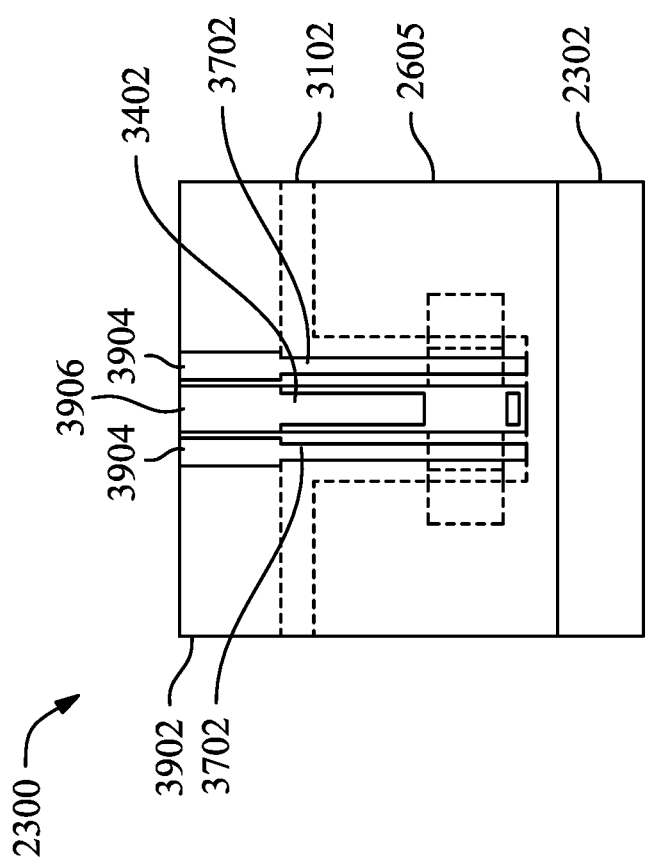
Figure 40:
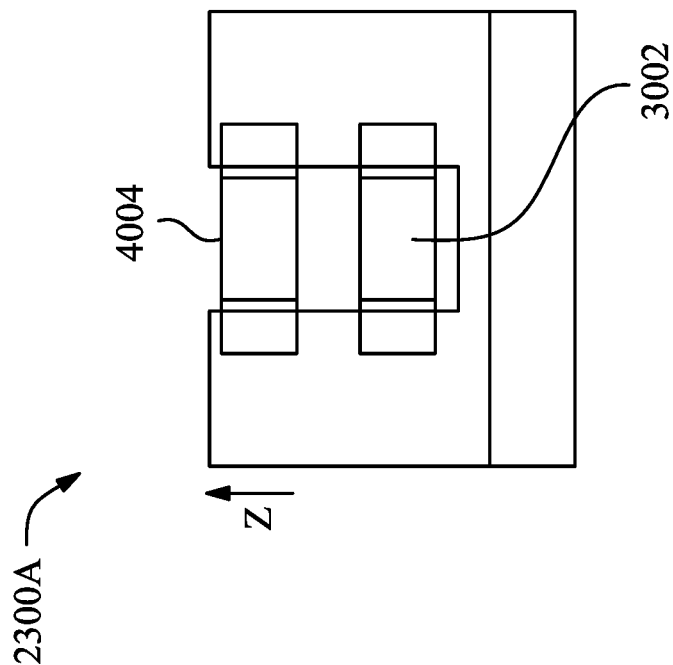

Referring to FIG. 39, in an embodiment of block 234 and in at least some aspects similar to the example of FIG. 19, metal source/drain contacts 3904 and a metal gate contact 3906 are formed. In various embodiments, formation of the source/drain contacts 3904 and the metal gate contact 3906 may be substantially the same as the formation of the source/drain contacts 1904 and the metal gate contact 1906, discussed above with reference to the device 300. In some embodiments, a CMP process may be performed after formation of the source/drain contacts 3904 and the gate contact 3906 to remove excess material and planarize the top surface of the device 2300. As described above for the device 300, the device 2300 may undergo further processing to form various features and regions known in the art.

Referring now to FIGS. 40 and 41, illustrated therein are a cross-sectional and top-down view, respectively, of a GAA device 2300A, including a plurality of nanobars 3002, 4004, according to one or more aspects of the present disclosure. In various embodiments, GAA device 2300A may be substantially the same as the GAA device 300A of FIG. 21, except that the GAA device 2300A includes nanobars grown according to a two-sided nanobar growth process, as discussed above. The top-down view of the GAA device 2300A of FIG. 41 also illustrates a graphene layer 4102, a graphene layer 4104, and a nanobar 4106. More broadly, FIG. 41 illustrates that one or more of the steps of the method 200 may be repeated so as to build up a structure in a horizontal direction Y (e.g., in addition to or alternatively to building up the structure in the vertical direction, Z). Thus, the GAA device 2300A of FIGS. 40 and 41 provides a structure having a plurality of nanobars, where the plurality of nanobars may form an array that extends along one or both of a horizontal and a vertical direction, and where the nanobars are grown according to a two-sided nanobar growth process.

Figure 42A:
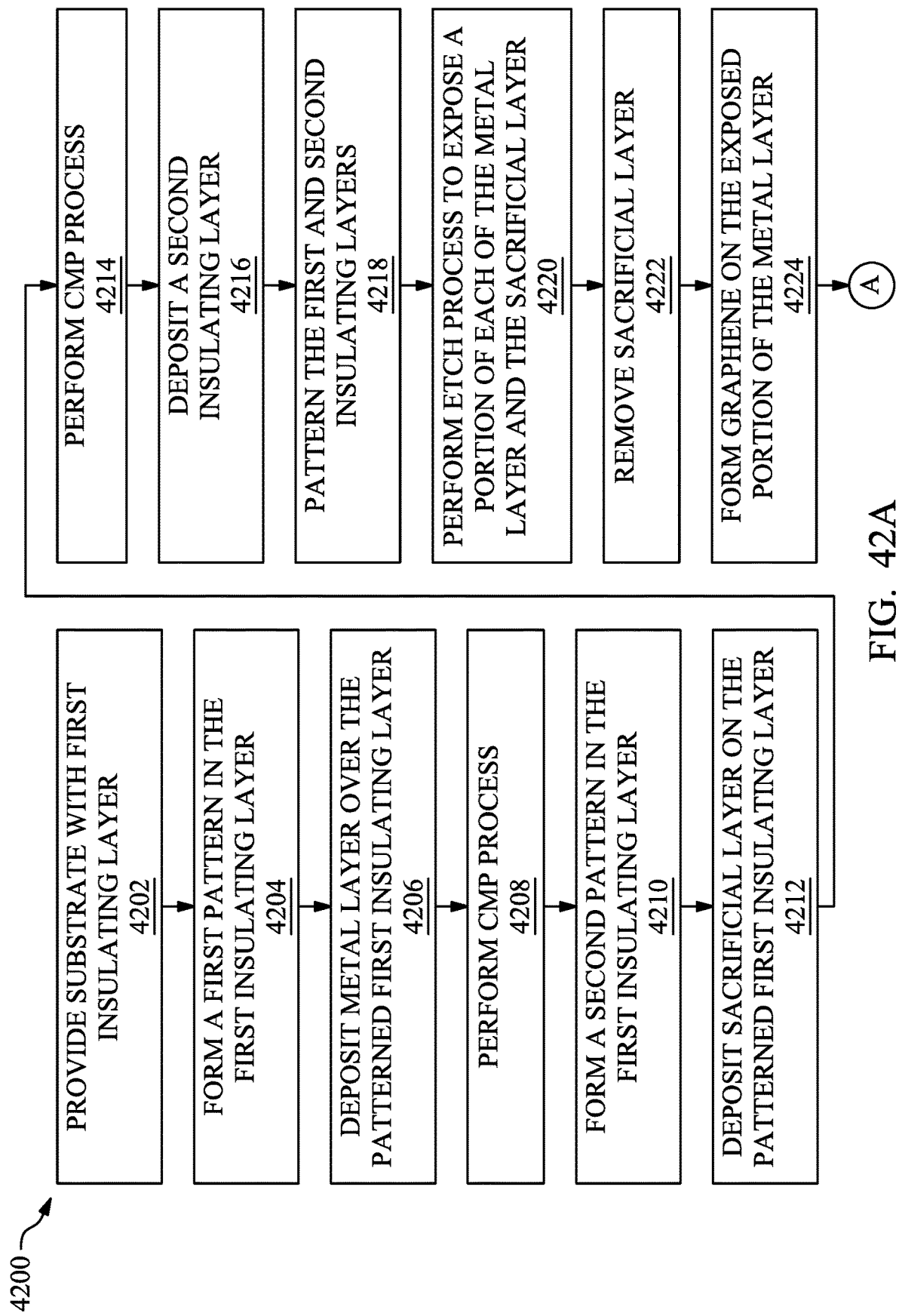
FIGS. 42A/42B provide a flow chart of a method of fabricating a GAA device, including a supporting cavity, according to one or more aspects of the present disclosure.
Figure 42B:
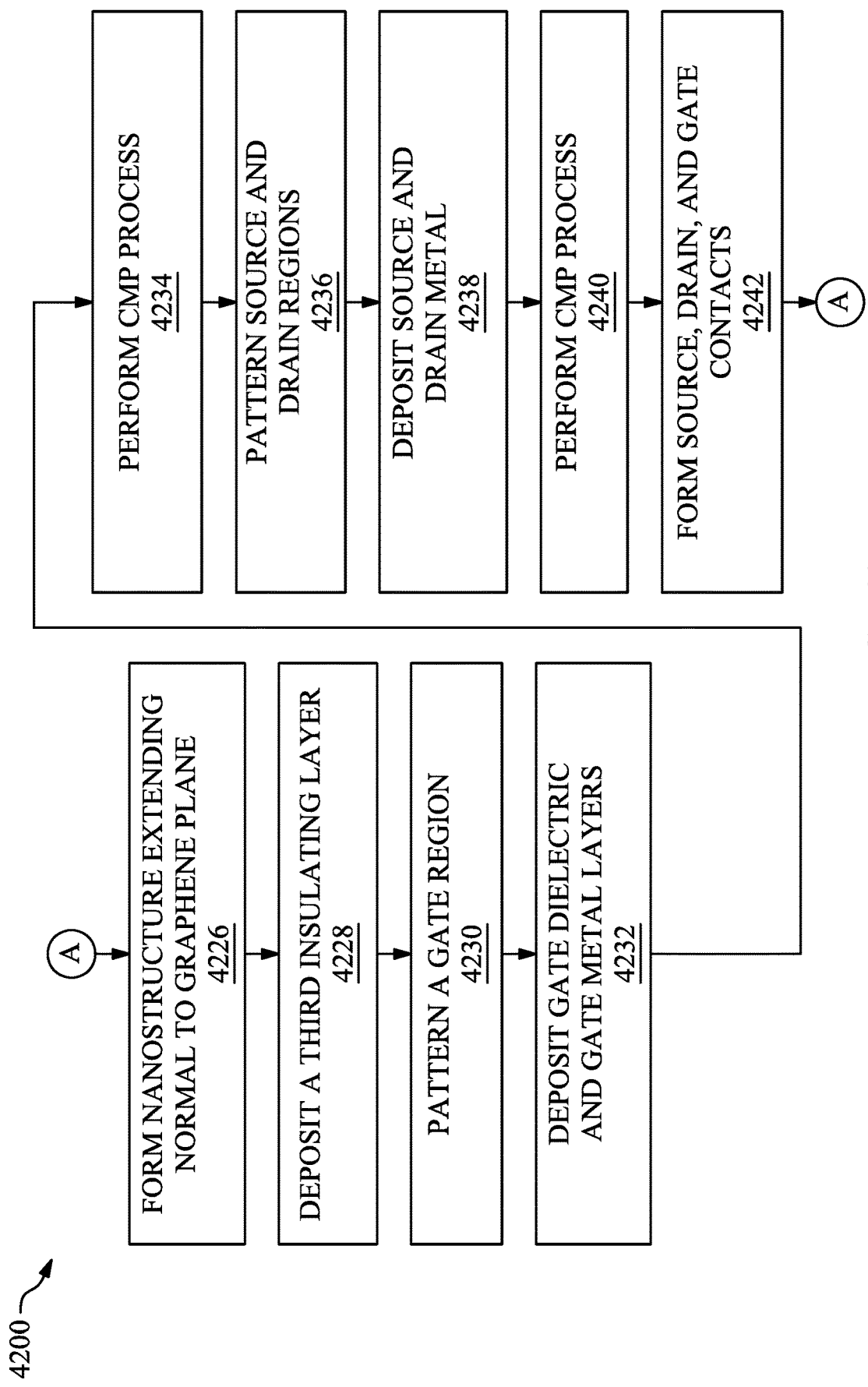
Figure 64:
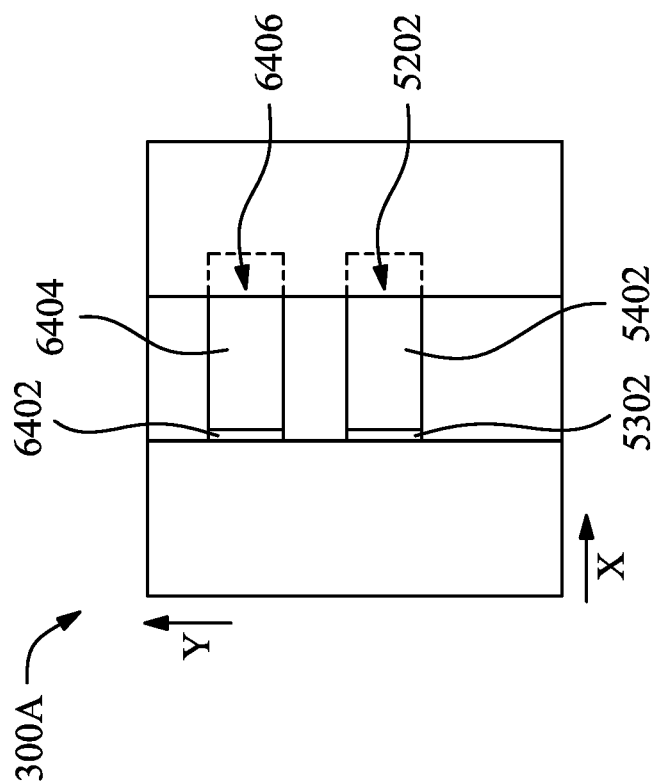
FIGS. 63 and 64 illustrate a cross sectional and top-down view, respectively, of embodiments of a GAA device, including a supporting cavity, and corresponding to one or more steps of the method of FIGS. 42A/42B.

Referring now to FIGS. 42A/42B, illustrated is a flow chart of a method 4200 of fabricating a GAA device 4300 according to one or more aspects of the present disclosure. The method 4200 shares various features with the method 200 discussed above, while providing additional embodiments in accordance with the present disclosure. As described below, in some embodiments, the method 4200 may be used to provide GAA devices including one or more horizontal nanobars, where nanobar growth proceeds according to a one-sided nanobar growth process, and where a bar-supporting hole/cavity is used to provide structural support to the nanobar. In various embodiments, one or more aspects discussed above with reference to the GAA device 300 may also apply to the device 4300. Additionally, FIGS. 43-62 are cross sectional views of embodiments of the GAA device 4300 according to one or more aspects of the present disclosure and corresponding to one or more steps of the method 4200. FIGS. 63 and 64 illustrate a cross sectional and top-down view, respectively, of embodiments of a GAA device 4300A, including a plurality of nanobars, and fabricated according to one or more steps of the method 4200 of FIGS. 42A/42B. For clarity of discussion, aspects and/or processes shown in the examples of FIGS. 43-62 which are substantially the same as those already described above are only discussed briefly, while additional discussion is reserved to highlight differences of the method 4200.

It is understood that parts of the method 4200 and/or the GAA devices 4300, 4300A may be fabricated by a well-known CMOS technology process flow, and thus some processes are only briefly described herein. In addition, as described above, the GAA devices 4300, 4300A may share aspects of the devices 300, 300A, thus some aspects and/or processes of the GAA devices 4300, 4300A are only discussed briefly for purposes of clarity in understanding. Further, the GAA devices 4300, 4300A may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the GAA devices 4300, 4300A includes a plurality of GAA devices (e.g., transistors), which may be interconnected.

The method 4200 begins at block 4202 where a substrate 4302 having an insulating layer 4304 formed thereon, as shown in the example of FIG. 43, is provided. In various embodiments, each of the substrate 4302 and the insulating layer 4304 may be substantially the same as discussed above with reference to the device 300.

The method 4200 proceeds to block 4204, where a first pattern 4306 is formed within the insulating layer 4304, as also shown in the example of FIG. 43. Thereafter, in embodiments of block 4206 and 4208 of the method 4200, a metal layer 4402 is formed over the device 4300 and a CMP process is performed, as shown in the example of FIGS. 44 and 45.

Thereafter, the method 4200 departs somewhat from the method 200, discussed above. In particular, the method 4200 proceeds to block 4210, where a second pattern 4602 is formed within the insulating layer, as shown in the example of FIG. 46. Next, and in embodiments of blocks 4212 and 4214 of the method 4200, a sacrificial layer 4702 is formed over the device 4300 and a CMP process is performed, as shown in the example of FIGS. 47 and 48. In some embodiments, the sacrificial layer 4702 includes silicon nitride. In various examples, the sacrificial layer 4702 includes a material having an appropriate etching selectivity to the surrounding oxide (e.g., the insulating layer 4304), such that the sacrificial layer 4702 may be removed (e.g., at a subsequent step of the method 4200) without removing the surrounding material. In various embodiments, the sacrificial layer 4702 may be formed using PVD, CVD, ALD, and/or other suitable process.

The method 4200 proceeds to block 4216, where an insulating layer 4902 may be formed over the insulating layer 4304, over the metal portion 4402A, and over the sacrificial layer 4702, as shown in FIG. 49. In some embodiments, the stacked insulating layers 4304/4902 may be substantially the same as the stacked insulating layers 304/

604 described above with reference to the device 300. Additionally, for clarity of discussion, the stacked insulating layers 4304/4902 may be equivalently referred to as composite insulating layer 4905, as also shown in FIG. 49.

The method 4200 proceeds to block 4218, where the stacked insulating layers 4304/4902 (e.g., the composite insulating layer 4905) are patterned, as shown in the example of FIG. 50. Patterning of the composite layer 4905 results in a recess 5002, having a depth D2 and a width W2, within the composite insulating layer 4905, thereby patterning the stacked first and second insulating layers 4304/4902.

The method 4200 then proceeds to block 4220, where an etching process (e.g., an isotropic etching process) is performed which exposes a surface 4402B of the metal portion 4402A and a surface 4702B of the sacrificial layer 4702, as shown in the example of FIG. 51. In addition, as shown in FIG. 51, the etching process results in a recess 5102, having a depth D2' greater than D2 and a width W2' greater than W2. As discussed above, the exposed metal surface (e.g., the surface 4402B) may serve to facilitate the CVD-growth of graphene by way of catalyzed decomposition of hydrocarbons on the surface 4402B. Thereafter, the method 4200 proceeds to block 4222, where the sacrificial layer 4702 is removed, as shown in the example of FIG. 52. In various examples, the sacrificial layer 4702 may be removed by a wet etch, a dry etch, and/or a combination thereof. Moreover, in some embodiments, removal of the sacrificial layer 4702 results in a cavity or bar-supporting hole 5202, which will provide structural support to a subsequently formed nanobar.

The method 4200 proceeds to block 4224 where a graphene layer 5302 is formed on the exposed surface 4402B of the metal portion 4402A, as shown in the example of FIG. 53, and in accordance with processes as described above. In addition, the graphene layer 5302 may define a vertical plane parallel to the surface 4402B. Thereafter, in an embodiment of block 4226 of the method 4200 and referring to the example of FIG. 54, a nanobar 5402 is formed. In various embodiments, the nanobar 5402 is formed according to one or more of the methods previously discussed. In particular, growth of the nanobar 5402 proceeds in a direction N that is normal to the vertical plane defined by the graphene layer 5302. Moreover, an end portion 5402A of the nanobar 5402 extends into the cavity or bar-supporting hole 5202, thereby providing structural support to the nanobar 5402. For example, the cavity or bar-supporting hole 5202 may prevent the nanobar 5402 from collapsing (e.g., at the end 5402A) by providing structural support to the end portion 5402A. After formation of the nanobar 5202, the method 4200 proceeds in substantially the same manner as the method 200.

For example, after formation of the nanobar 5202, in an embodiment of block 4228 and with reference to FIG. 55, an insulating layer 5502 may be formed over the composite insulating layer 4905 and over the nanobar 5402. In an embodiment of the next step (block 4230) and still referring to FIG. 55, a gate region is patterned within the insulating layer 5502. In various embodiments, the patterning of the insulating layer 5502 is done to form a recess 5504, thereby exposing a portion of the nanobar 5402, where the exposed region of the nanobar 5402 includes a gate region of the GAA device 4300.

With reference to FIGS. 56 and 57, in an embodiment of the following step of the method 4200 (block 4232), a gate dielectric layer 5602 is formed over the device 4300 (e.g., over, and surrounding, the exposed gate region of the nanobar 5402), and a metal layer 5702 is formed over, and surrounding, the dielectric layer 5602 in the gate region of the nanobar 5402. The method 4200 proceeds to block 4234, where a CMP process is performed which removes excess portions of the gate metal layer 5702 while substantially planarizing a top surface of the GAA device 4300, as shown in the example of FIG. 58.

Figure 59:
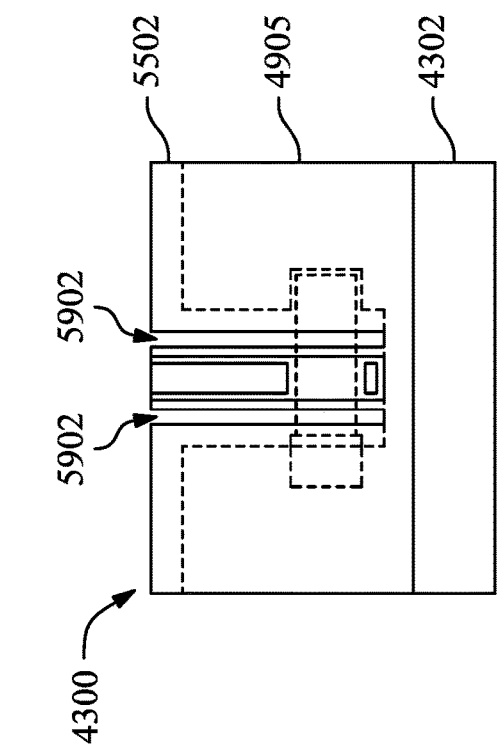
Figure 61:
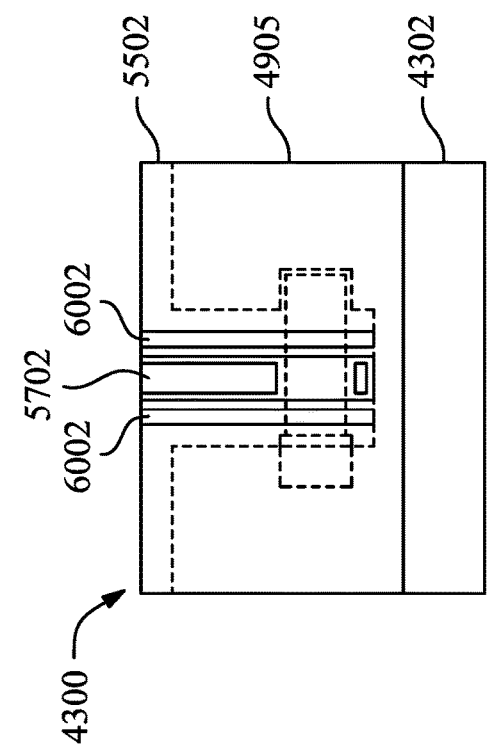

Thereafter, with reference to FIG. 59, in an embodiment of block 4236, source and drain regions are patterned within the insulating layer 5502. By way of example, the patterning of the insulating layer 5502 is done to form recesses 5902, thereby exposing portions of the nanobar 5402 adjacent to and on either side of the gate region, where the regions of the nanobar 5402 exposed by the recesses 5902 include source and drain regions of the GAA device 4300.

Figure 60:
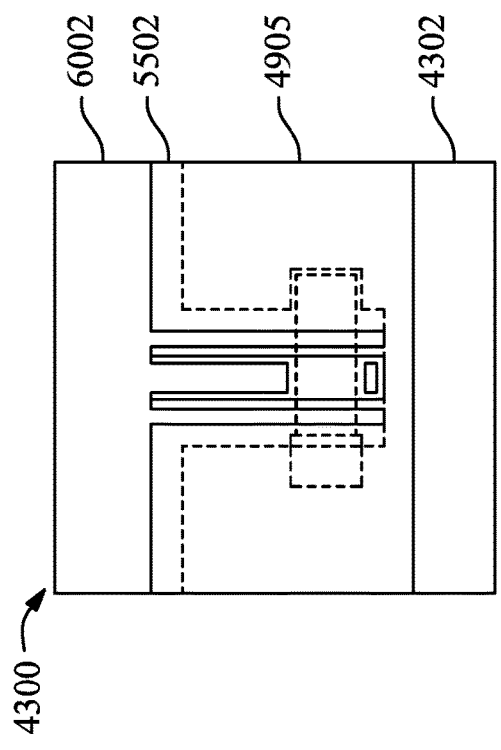

The method then proceeds to block 4238, where a source and drain metal layer 6002 may be formed. In particular, the metal layer 6002 may be deposited over, and surrounding, the exposed source/drain regions of the nanobar 5402 within the recesses 5902, as shown in FIG. 60. In an embodiment of block 4240, and with reference to FIG. 61, a CMP process is performed which removes excess portions of the source/drain metal layer 6002, while substantially planarizing a top surface of the GAA device 4300.

Figure 62:
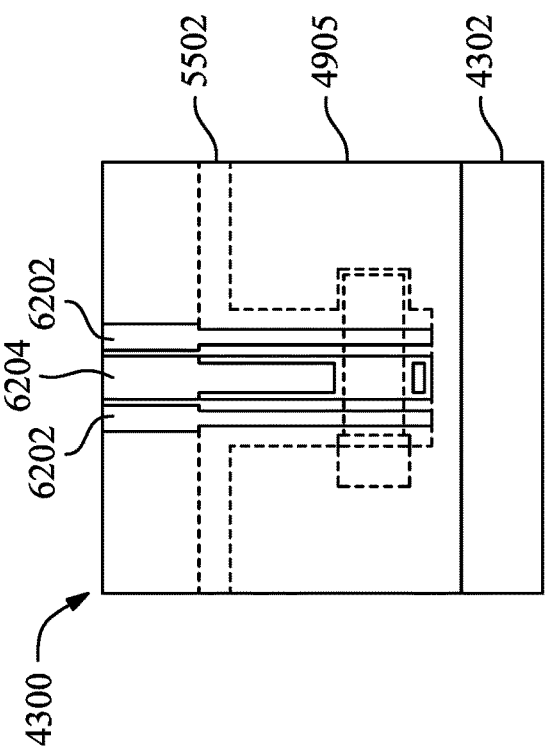
Figure 63:
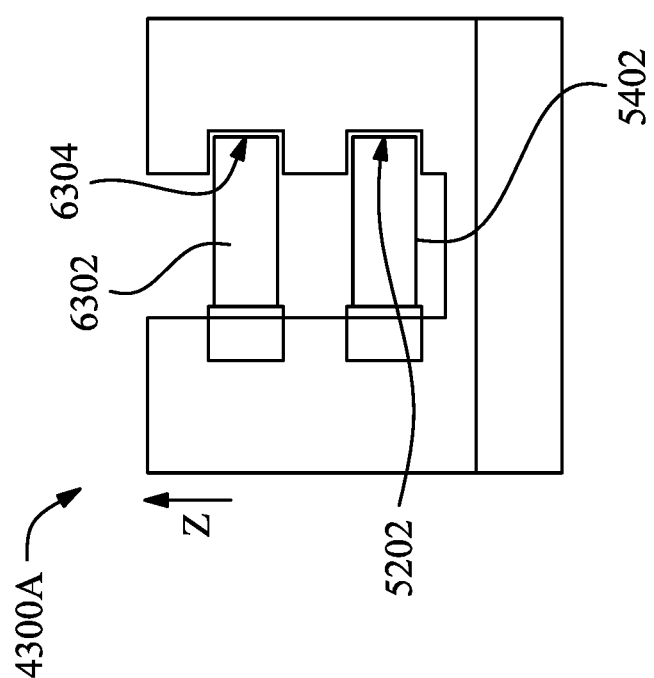

The method proceeds to block 4242, where metal source/drain contacts 6202 and a metal gate contact 6204 are formed, as shown in FIG. 62. In some embodiments, a CMP process may be performed after formation of the source/drain contacts 6202 and the gate contact 6204 to remove excess material and planarize the top surface of the device 4300. As described above for the device 300, the device 4300 may undergo further processing to form various features and regions known in the art.

Referring to FIGS. 63 and 64, illustrated therein are a cross-sectional and top-down view, respectively, of a GAA device 4300A, including a plurality of nanobars 5402, 6302, according to one or more aspects of the present disclosure. In various embodiments, the GAA device 4300A may be substantially the same as the GAA device 300A of FIG. 21, except that the GAA device 4300A includes the cavity or bar-supporting holes 5202, 6304 which provide structural support to the nanobars 5402, 6302, as described above. The top-down view of the GAA device 4300A of FIG. 64 also illustrates a graphene layer 6402, a nanobar 6404, and a cavity or bar-supporting hole 6406. More broadly, FIG. 64 illustrates that one or more of the steps of the method 4200 may be repeated so as to build up a structure in a horizontal direction Y (e.g., in addition to or alternatively to building up the structure in the vertical direction, Z). Thus, the GAA device 4300A of FIGS. 63 and 64 provides a structure having a plurality of nanobars, where the plurality of nanobars may form an array that extends along one or both of a horizontal and a vertical direction, and where the device 4300A includes cavities or bar-supporting holes (e.g., such as 5202, 6304, 6406), which provide structural support to the nanobars, as described above.

Figure 65:
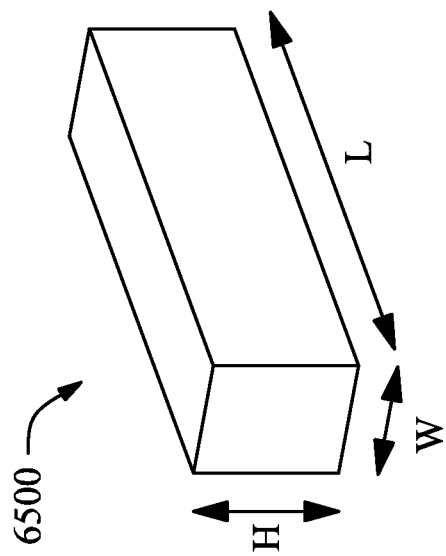
FIG. 65 illustrates an embodiment of a geometrical configuration of a nanobar, according to some embodiments.

The embodiments discussed throughout this disclosure have been illustrated in large part with the use of nanorods. However, as described above, embodiments disclosed herein may equally apply to the formation of other one-dimensional nanostructures such as nanowires, nanopillars, or nanobars. In addition, the nanobars described above may have any of a plurality of geometrical configurations, which are explained in more detail with reference to FIG. 65. In particular, FIG. 65 illustrates a nanobar 6500 having a height 'H', a width 'W', and a length 'L'. In some embodiments, the height of the nanobar 6500 may be from about 1 nanometer to about 1000 nanometers, the width of the nanobar 6500 may be from about 1 nanometer to about 1000 nanometers, and the length of the nanobar 6500 may be from about 1 nanometer to about 100,000 nanometers. Additionally, in various embodiments, the length-to-width ratio (L/W) of the nanobar 6500 may be from about 1 nanometer to about 100,000 nanometers, and the length-to-height ratio (L/H) of the nanobar 6500 may be from about 1 nanometer to about 100,000 nanometers. In addition, the nanobar 6500 is illustrated as having a square shape. However, in various embodiments, the nanobar 6500 may alternatively include a rectangular shape, an oval shape, a triangular shape, a hexagonal shape, or other shape as known in the art. Also, as described above, the nanobar 6500 may be formed from any appropriate semiconductor material (or combination thereof) such as InGaAs, InAs, GaAs, Si, Ge, or other material as known in the art. Additionally, in some embodiments, the GAA devices described above may include a GAA device having about 10 InGaAs nanobars with a core-multishell structure (e.g., for high-performance logic devices, having an Id,sat of about 1700 µA/µm). In some cases, the GAA devices described above may include a GAA device having about four InGaAs nanobars (e.g., for low power devices, having an Id,sat of about 600 µA/µm). In addition, in various embodiments, description of a nanobar (or other nanostructure) that "extends" in a direction normal to a vertical plane defined by a graphene layer may be used to refer to a nanobar (or other nanostructure) length 'L' (e.g., such as the nanobar 6500 length 'L') extending in the direction normal to the vertical plane defined by the graphene layer.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for forming nanobars (or other one-dimensional nanostructures such as nanowires, nanopillars, or nanorods) on a substrate, where the nanobar growth direction is independent of the underlying substrate orientation. In various embodiments, such substrate-orientation-independent nanobar growth is achieved by the use of an intermediate graphene layer, which serves as a template for nanobar growth. Compared to III-V materials and silicon, III-V materials and graphene have a comparatively smaller lattice mismatch, making graphene an attractive growth template for III-V nanostructures. In various embodiments, III-V nanobar growth proceeds in a direction normal to the 2-D plane of the graphene layer. As a result, the nanobar growth direction can be controlled merely by the intermediate graphene layer, and the graphene layer itself may be placed or grown on any suitable substrate (e.g., not limited to silicon, or to a particular silicon orientation). Thus, the nanobar growth direction remains independent of the underlying substrate (e.g., the substrate on which the graphene layer is disposed). Such decoupling of nanostructure growth from the underlying substrate opens up new opportunities for GAA device fabrication. For example, in various embodiments described herein, horizontal III-V nanobars suitable for GAA devices may be achieved without lithography and etching (e.g., as in some conventional top-down techniques), and/or without nanobar/nanowire growth and manual transfer (e.g., as in at least some conventional bottom-up techniques), as described above, thereby overcoming significant shortcomings of at least some current techniques.

Thus, one of the embodiments of the present disclosure described a method for fabricating a GAA device, where the method includes providing a substrate including an insulating layer disposed thereon and forming a first metal portion within the insulating layer. In various embodiments, a first lateral surface of the first metal portion is exposed. After exposure of the first lateral surface of the first metal portion, a first graphene layer is formed on the exposed first lateral surface. By way of example, the first graphene layer defines a first vertical plane parallel to the exposed first lateral surface. Thereafter, in some embodiments, a first nanobar is formed on the first graphene layer, where the first nanobar extends in a first direction normal to the first vertical plane defined by the first graphene layer.

In another of the embodiments, discussed is a method where a metal portion and a sacrificial layer are formed within an insulating layer disposed on a substrate. In various embodiments, a first lateral surface of the metal portion and a second lateral surface of the sacrificial layer are exposed, where the first and second lateral surfaces face one another. In various embodiments, after exposing the first and second lateral surfaces, the sacrificial layer is removed to form a cavity opposite the first lateral surface. In some examples, a graphene layer is formed on the exposed first lateral surface, where the graphene layer defines a vertical plane parallel to the exposed first lateral surface. Thereafter, a nanobar is formed on the graphene layer, where the nanobar extends in a direction normal to the vertical plane defined by the graphene layer, and where an end portion of the nanobar extends into the cavity formed by removal of the sacrificial layer.

In yet another of the embodiments, discussed is a device including a substrate having a patterned insulating layer formed thereon and a metal portion disposed within the patterned insulating layer. In various embodiments, the metal portion includes a graphene layer disposed along a lateral sidewall of the metal portion, and the graphene layer defines a vertical plane. Additionally, in some embodiments, the device includes a horizontal nanobar disposed on the graphene layer, where the horizontal nanobar extends from the graphene layer and along a direction normal to the vertical plane defined by the graphene layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate defining a horizontal plane; and
a nanobar disposed on a graphene layer over the substrate, wherein the graphene layer defines a vertical plane perpendicular to the horizontal plane, and wherein the nanobar extends from the graphene layer and along a direction normal to the vertical plane.

2. The device of claim 1, further comprising:
the substrate including a patterned insulating layer formed thereon; and a metal portion disposed within the patterned insulating layer, wherein the metal portion includes the graphene layer disposed along a lateral sidewall of the metal portion.

3. The device of claim 1, further comprising:
a gate dielectric layer that surrounds the nanobar in a gate region of the nanobar;
a gate metal layer that surrounds the gate dielectric layer; and
a source/drain metal layer surrounding the nanobar in source/drain regions of the nanobar, wherein the source/drain regions are disposed adjacent to and on either side of the gate region.

4. The device of claim 1, wherein the nanobar includes at least one of an InGaAs nanobar, an InAs nanobar, a GaAs nanobar, a core-shell nanobar, and a core-multishell nanobar.

5. The device of claim 2, further comprising:
the patterned insulating layer including a recess;
wherein the lateral sidewall of the metal portion is coplanar with a first sidewall of the recess, and wherein the nanobar extends from the graphene layer to a second sidewall of the recess opposite the first sidewall of the recess.

6. The device of claim 5, wherein the recess has a recess width, and wherein the nanobar has a length equal to about the recess width minus a thickness of the graphene layer.

7. A device, comprising:
a substrate that defines a horizontal plane;
a first graphene layer disposed over the substrate, wherein the first graphene layer defines a first vertical plane perpendicular to the horizontal plane; and
a first nanobar formed on the first graphene layer, wherein the first nanobar extends in a first direction parallel to the horizontal plane and normal to the first vertical plane defined by the first graphene layer.

8. The device of claim 7, further comprising:
the substrate including an insulating layer disposed thereon, wherein the insulating layer includes a recess having a first sidewall and a second sidewall opposite the first sidewall; and
a first metal portion formed within the insulating layer, wherein a first lateral surface of the first metal portion is coplanar with the first sidewall of the recess;
wherein the first graphene layer is disposed on the first lateral surface, and wherein the first vertical plane is parallel to the first lateral surface; and
wherein the direction parallel to the horizontal plane and normal to the first vertical plane is independent of an orientation of the substrate.

9. The device of claim 8, further comprising:
a second metal portion formed within the insulating layer, wherein a second lateral surface of the second metal portion is coplanar with the second sidewall of the recess;
a second graphene layer disposed on the second lateral surface, wherein the second graphene layer defines a second vertical plane perpendicular to the horizontal plane and parallel to the second lateral surface, and wherein the second vertical plane is oriented opposing the first vertical plane; and
a second nanobar formed on the second graphene layer, wherein the second nanobar extends in a second direction parallel to the horizontal plane and normal to the second vertical plane defined by the second graphene layer.

10. The device of claim 9, wherein the first and second nanobars merge within the recess to form a composite nanobar.

11. The device of claim 10, further comprising:
a gate dielectric layer formed over, and surrounding, the composite nanobar in a gate region of the composite nanobar;
a gate metal layer disposed over, and surrounding, the gate dielectric layer; and
a source/drain metal layer formed over, and surrounding, the composite nanobar in source/drain regions of the composite nanobar, wherein the source/drain regions are disposed adjacent to and on either side of the gate region.

12. The device of claim 8, further comprising:
an array of metal portions formed within the insulating layer, wherein a third lateral surface of each of the array of metal portions is coplanar with one of the first and second sidewalls of the recess;
a graphene layer disposed on the third lateral surface of each of the array of metal portions, wherein each graphene layer defines a vertical plane perpendicular to the horizontal plane and parallel to the third lateral surface on which a respective graphene layer is formed; and
a nanobar formed on each of the graphene layers, wherein the nanobar formed on each of the graphene layers extends in a direction parallel to the horizontal plane and normal to the vertical plane defined by each graphene layer on which a respective nanobar is formed.

13. The device of claim 12, wherein the array extends in at least one of a horizontal direction and a vertical direction.

14. The device of claim 9, wherein each of the first metal portion and the second metal portion include one of Ni, Cu, Pt, Fe, Co, Au, Ru, Ir, Pd, a Cu—Ni alloy, and a Ni—Au alloy.

15. The device of claim 9, wherein each of the first graphene layer and the second graphene layer include one of monolayer graphene, bilayer graphene, and multi-layer graphene.

16. The device of claim 9, wherein each of the first nanobar and the second nanobar include at least one of an InGaAs nanobar, an InAs nanobar, a GaAs nanobar, a core-shell nanobar, and a core-multishell nanobar.

17. A device, comprising:
an insulating layer including a recess having a first sidewall, a second sidewall opposite the first sidewall, and a third sidewall interposing the first and second sidewalls, wherein the third sidewall is perpendicular to each of the first and second sidewalls, and wherein the third sidewall defines a horizontal plane;
a cavity formed within the insulating layer and along the second sidewall of the recess; and
a nanobar formed on a carbon-based layer within the recess, wherein the nanobar extends in a first direction parallel to the horizontal plane and normal to a vertical plane defined by the carbon-based layer, and wherein the nanobar extends into the cavity formed within the second sidewall of the recess.

18. The device of claim 17, further comprising:
a metal layer formed within the insulating layer, wherein the metal layer includes the carbon-based layer disposed on a first lateral surface of the metal layer, and wherein the carbon-based layer defines a vertical plane perpendicular to the horizontal plane and parallel to the first lateral surface; and wherein the cavity is disposed opposite the first lateral surface.

19. The device of claim 17, wherein the cavity structurally supports an end portion of the nanobar.

20. The device of claim 17, wherein the carbon-based layer includes a graphene layer.

* * * * *